(12) United States Patent
Hansen et al.

(10) Patent No.: US 11,445,644 B1
(45) Date of Patent: *Sep. 13, 2022

(54) ELECTROMAGNETICALLY SHIELDED WALLPAPER

(71) Applicant: CONDUCTIVE COMPOSITES COMPANY IP, LLC, Heber City, UT (US)

(72) Inventors: George Clayton Hansen, Midway, UT (US); Nathan D. Hansen, Heber, UT (US); Jared Thompson Weese, Heber, UT (US)

(73) Assignee: Conductive Composites Company IP, LLC, Heber City, UT (US)

( * ) Notice: Subject to any disclaimer, the term of this patent is extended or adjusted under 35 U.S.C. 154(b) by 87 days.

This patent is subject to a terminal disclaimer.

(21) Appl. No.: 16/726,621

(22) Filed: Dec. 24, 2019

Related U.S. Application Data

(63) Continuation of application No. 15/640,036, filed on Jun. 30, 2017, now Pat. No. 10,519,672.

(51) Int. Cl.
*B32B 3/10* (2006.01)
*H05K 9/00* (2006.01)
(Continued)

(52) U.S. Cl.
CPC .......... *H05K 9/0001* (2013.01); *B32B 5/022* (2013.01); *B32B 5/024* (2013.01); *B32B 9/041* (2013.01); *B32B 15/08* (2013.01); *B32B 15/20* (2013.01); *B32B 27/10* (2013.01); *E04C 2/26* (2013.01); *E04F 13/002* (2013.01); *E04F 13/075* (2013.01); *E04F 13/0875* (2013.01); *E06B 5/18* (2013.01); *H05K 9/0003* (2013.01); *H05K 9/0005* (2013.01); *H05K 9/009* (2013.01); *H05K 9/0088* (2013.01); *H05K 9/0094* (2013.01); *B32B 2255/205* (2013.01);
(Continued)

(58) Field of Classification Search
None
See application file for complete search history.

(56) References Cited

U.S. PATENT DOCUMENTS

| | | |
|---|---|---|
| 4,408,255 A | 10/1983 | Adkins |
| 4,643,785 A | 2/1987 | Paynton |

(Continued)

FOREIGN PATENT DOCUMENTS

| | | |
|---|---|---|
| JP | 09070351 | 3/1997 |
| KR | 2010036472 | 5/2001 |

(Continued)

OTHER PUBLICATIONS

English translation of JP09070351, dated Mar. 18, 1997, Toshiyuki, et al.

(Continued)

*Primary Examiner* — Christopher M Polley
(74) *Attorney, Agent, or Firm* — Madson IP, P.C.

(57) ABSTRACT

The electromagnetic shielding of an enclosable building structure is provided by applying a shielding wallcovering to at least a portion of building structure. The shielding wall covering is wallpaper comprising a metal-coated substrate core and resin. To connect the shielded wallpaper to the building structure a layer of the resin or an adhesive layer may be used.

21 Claims, 11 Drawing Sheets

(51) Int. Cl.
*B32B 15/20* (2006.01)
*B32B 15/08* (2006.01)
*B32B 5/02* (2006.01)
*B32B 9/04* (2006.01)
*E04C 2/26* (2006.01)
*E04F 13/075* (2006.01)
*E04F 13/08* (2006.01)
*E06B 5/18* (2006.01)
*E04F 13/00* (2006.01)
*B32B 27/10* (2006.01)
*C23C 16/06* (2006.01)

(52) U.S. Cl.
CPC ... *B32B 2260/028* (2013.01); *B32B 2260/046* (2013.01); *B32B 2307/212* (2013.01); *B32B 2607/00* (2013.01); *B32B 2607/02* (2013.01); *C23C 16/06* (2013.01); *E04F 13/0801* (2013.01)

(56) References Cited

U.S. PATENT DOCUMENTS

| | | | |
|---|---|---|---|
| 4,713,277 A | 12/1987 | Akiyama et al. | |
| 4,749,625 A | 6/1988 | Obayashi et al. | |
| 4,972,058 A | 11/1990 | Benson et al. | |
| 5,601,945 A | 2/1997 | Clough | |
| 6,185,155 B1 | 2/2001 | Steinich | |
| 6,344,978 B1 | 2/2002 | Komiya | |
| 6,989,924 B1 | 1/2006 | Jorgensen et al. | |
| 7,129,422 B2 | 10/2006 | Arnold | |
| 7,183,484 B1 | 2/2007 | May | |
| 7,553,579 B2 | 6/2009 | Couse et al. | |
| 8,325,079 B2 | 12/2012 | Shah et al. | |
| 8,351,220 B2 | 1/2013 | Liang et al. | |
| 8,415,568 B1 * | 4/2013 | Hansen | H05K 9/0007 174/386 |
| 10,506,746 B1 | 12/2019 | Hansen et al. | |
| 2004/0001299 A1 | 1/2004 | van Haaster et al. | |
| 2008/0078576 A1 | 4/2008 | Blacker et al. | |
| 2009/0117268 A1 | 5/2009 | Lewis et al. | |
| 2011/0263924 A1 | 10/2011 | Yantasee et al. | |
| 2013/0309396 A1 | 11/2013 | Legare | |
| 2018/0222154 A1* | 8/2018 | Yamamoto | C23C 14/205 |

FOREIGN PATENT DOCUMENTS

| | | | |
|---|---|---|---|
| WO | WO2017061597 | 4/2017 | |
| WO | WO-2017061597 A1 * | 4/2017 | C09J 201/00 |

OTHER PUBLICATIONS

English translation of KR20010036472, dated May 7, 2001, Chang, et al.

English translation of WO2017061597 bibliographic data, dated Apr. 13, 2017, Yamamoto, et al.

* cited by examiner

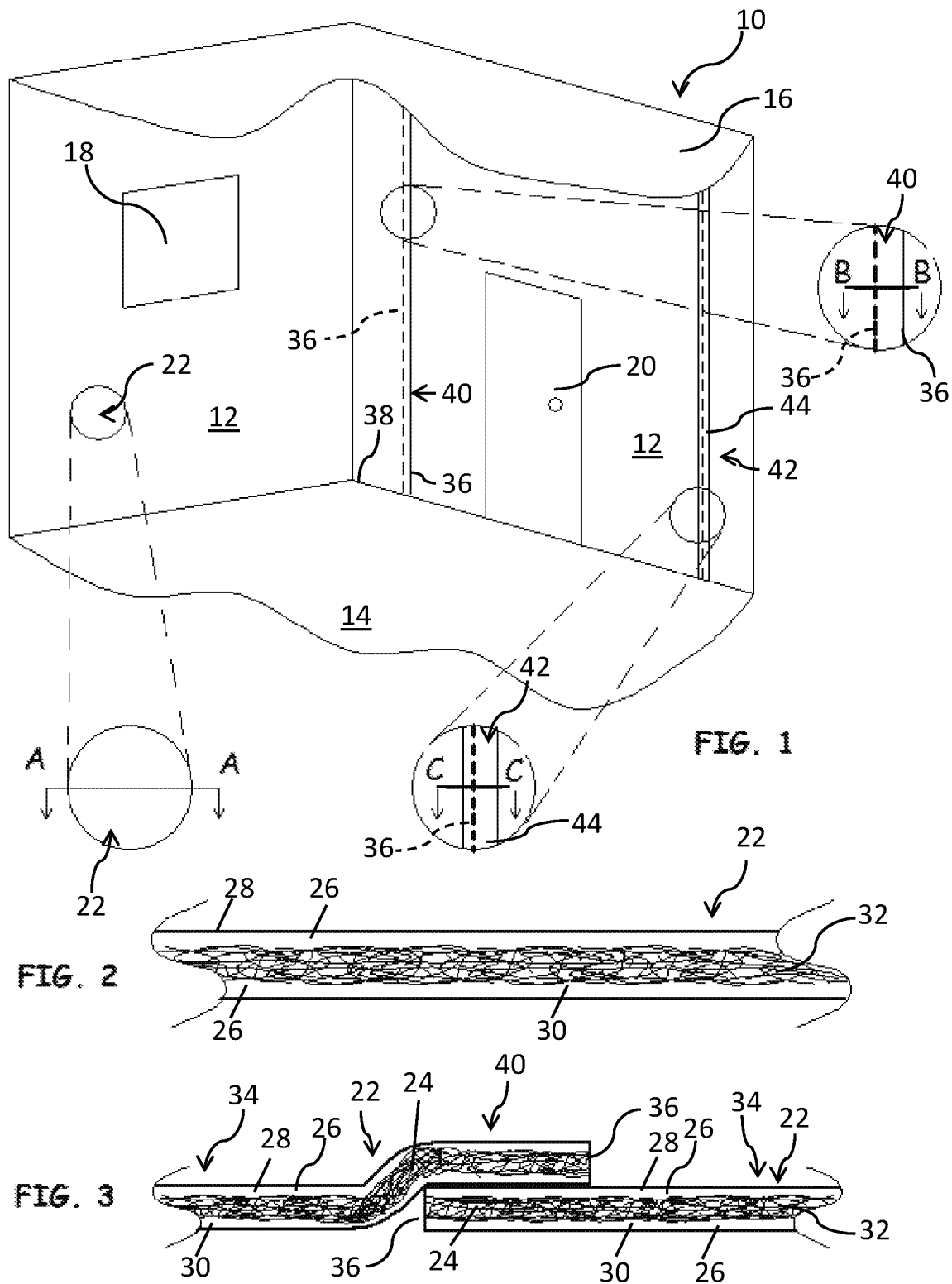

ELECTROMAGNETICALLY SHIELDED WALLPAPER

RELATED APPLICATION

This patent application is a continuation of U.S. patent application Ser. No. 15/640,036 filed on Jun. 30, 2017, for an invention titled ELECTROMAGNETICALLY SHIELDED WALLPAPER which claimed the benefit of U.S. Provisional Patent Application, Ser. No. 62/357,904 that was filed on Jul. 1, 2016, for an invention titled METHODS AND SYSTEMS FOR CONSTRUCTING OR RETROFITTING ELECTROMAGNETICALLY SHIELDED FACILITIES, which both are hereby incorporated herein by this reference.

BACKGROUND OF THE INVENTION

1. Field of the Invention

The present invention relates generally to electromagnetically shielding structures. More specifically, the present disclosure relates to methods, systems, and materials for creating or retrofitting enhanced electromagnetic shielding of facility structures to protect data.

Various exemplary embodiments of the present invention are described below. Use of the term "exemplary" means illustrative or by way of example only, and any reference herein to "the invention" is not intended to restrict or limit the invention to exact features or steps of any one or more of the exemplary embodiments disclosed in the present specification. References to "exemplary embodiment," "one embodiment," "an embodiment," "some embodiments," "various embodiments," and the like, may indicate that the embodiment(s) of the invention so described may include a particular feature, structure, or characteristic, but not every embodiment necessarily includes the particular feature, structure, or characteristic. Further, repeated use of the phrase "in one embodiment," or "in an exemplary embodiment," do not necessarily refer to the same embodiment, although they may.

2. The Relevant Technology

The proliferation of wireless communication and smart devices continues to grow at a rapid pace. Devices, applications, and new capabilities are constantly evolving. When security of digital data and devices is of primary concern, wireless threats must be mitigated. There are two primary means of mitigating a broad spectrum of threats. The first is to address security through encryption/decryption technology, and the second is to physically deny access to (or emissions of) wireless signals and/or wireless access to (or damage) electronic devices.

Due to the pace of technology development, it is challenging to sustain long-term security using encryption approaches. Denied access approaches involve the development and deployment of shielded rooms such as Sensitive Compartmented Information Facilities (SCIF). Conventional shielded room construction methods rely on expensive and heavy metals, and specialized methods that are best suited for new construction only, making them costly to deploy and limited in size and functionality generally.

Although shielded facilities presently exist, they were built as new construction, are expensive, and they require use of heavy metals that require precision welding to achieve minimal benchmark shielding capability. Such construction does not easily translate to facilities requiring retrofit shielding.

Accordingly, a need exists for new systems and methods for cost effective shielded construction, suitable for both new build and retrofit scenarios.

Such systems and methods are disclosed herein and are directed to innovative approaches utilizing a family of nickel-coated shielding materials to include wallpaper, wallboard, window coverings, paints, adhesives, coatings, elastomers, and complimentary conventional shielding products for doors, door gaskets, air ducts, wave guides below cut-off, filters, and other construction component materials.

SUMMARY OF THE INVENTION

The present disclosure describes developments responsive to the present state of the art, and in particular, in response to the problems and needs in the art that have not yet been fully solved by currently available methods and systems. This disclosure is directed to a host of exemplary multifunctional materials that have been developed and are commercially viable. Such multifunctional materials answer the combined demands of lightweight and cost-effective performance in the face of ever-increasing and demanding electromagnetic environments.

The multifunctional structural materials and insertion technologies integrate directly into existing materials and manufacturing architectures, and enable previously unattainable levels of electromagnetic protection. Key applications, enabled by the materials and technologies disclosed herein, may include shielding of any volume that requires electromagnetic denial or protection, such as SCIFs, data centers, testing centers, R & D facilities, corporate boardrooms, and the like. Such shielding may be used for electromagnetic denial or protection for inhabitable volumes (i.e., volumes capable of being entered by a human) or smaller uninhabitable volumes too small for human entry.

For office environments, several approaches may be used, each to address a certain construction type, application method, or required protection level. Exemplary solutions of interest may include shielding wallpapers and wallboard, transparent/shielding window coverings, conductive paints and sealants, shielded cabling, and conductive concrete, stuccos, and plasters for exterior applications or for new or retrofit construction.

The use of shielding wallpaper introduces a paradigm shift from conventional use of metals which are heavy, require time consuming welding, and are expensive to procure and install. Utilizing the teachings of this disclosure, electromagnetic shielding may be applied or incorporated into a system for shielding a structure such as a SCIF or a corporate boardroom or any other volume. Nickel CVD (chemical vapor deposition) coated woven and nonwovens are off-the-shelf items available from Conductive Composites Company in Heber City, Utah. Although several companies may provide Metal-CVD coated woven and nonwoven substrates, the NiCVD materials available from Conductive Composites Company are preferred. NiCVD coated woven and nonwovens have a continuous ductile coating over every surface of a finished nonwoven, including fibers and binders. The CVD coated woven and nonwoven broad goods available from Conductive Composites Company are ultra-lightweight, robust, uniform, and highly conductive as a standalone component or when infused. There are several companies that provide metal-CVD coated substrates, including Vapor Technologies in Longmont, Colo.; Richter Precision Inc. in East Petersburg, Pa.; Ti-Coating, Inc. in Utica, Mich.; Ultramet in Pacoima, Calif.; TevTech LLC in North Billerica, Mass.; and Weber Manufacturing Technologies Inc. in Midland, Ontario, Canada, among others.

Metal CVD coated broad goods, whether woven or nonwoven, are continuously conductive on all surfaces, inside and out. Nonwovens made from individually coated fibers have shown somewhat adequate shielding in wallpaper, but have the limitation that the non-conductive binder insolates the individually conductive fibers. NiCVD coated broad goods utilize an organic substrate including, for example, carbon-based and cellulose-based fiber products. Since they are coated as broad goods, the coating of nickel covers all surfaces and the electromagnetic shielding is superior to fibers being coated and then bound because the CVD coated broad goods have a continuous path for conductivity. Hence, the conductivity of the metal CVD coated broad goods is isotropic (conductive in all directions). NiCVD coated cellulose is much more cost effective than carbon fiber based substrates. High levels of electrical conductivity and broadband electromagnetic shielding, using such broad goods, may be inserted into applications at very attractive weight and cost savings. Advantageous features of an exemplary NiCVD coated broad goods include:

- Ultra lightweight and conductive with highly effective broadband shielding;
- Ductile, uniform coatings layer on all surfaces, including over binders;
- No change in conductivity when infused or cured;
- Conductivity with thin coatings leads to lower caliper;
- Coating substrates include carbon, aramid, cellulose, and other fiber types;
- CVD-coated broad goods can be wet processed subsequent to the CVD coating (binder is protected);
- Coating is ferromagnetic;
- Increased cost savings compared to traditional solutions; and
- Improved material capabilities.

One exemplary embodiment of shielding wallpaper uses a CVD applied sub-micron layer of highly conductive and corrosion-resistant metallic nickel to a cellulose based paper substrate. This coated paper then has similar handling, weight, and application characteristics to the uncoated paper, but now with the added functionality of electrical conductivity and electromagnetic shielding. By applying an adhesive (such as a wallpaper paste, conductive or not, or a coextensive sheet of film adhesive, or any other suitable resinous penetrating adhesive such as, for example, vinyl tile adhesives, urethane-based polymers, and the like) to one side of the CVD coated paper, the CVD coated paper may be transformed into wallpaper that may be installed in customary fashion. Additionally, however, the CVD coated paper may be applied wet using an on-site wet lay-up process because the resin used to seal the CVD coated paper from corrosion acts as an adhesive to secure the CVD coated paper to a wall, door, ceiling, or floor when applied wet and allowed to dry in place. This CVD coated wallpaper has added functionality of isotropic electrical conductivity and effective electromagnetic shielding.

The nickel coating may be engineered across a range of conductivity and shielding levels by controlling the coating thickness, which then corresponds to a broad possible range of applications from Electrostatic Discharge (ESD) to Electromagnetic Shielding (EMI) protection and beyond. Multiple layers can be used to increase protection levels. Coatings may be applied to various substrates, including cellulose, carbon, silk, aramids, and even carbon nanomaterials, to name a few. Substrate formats may be woven, nonwovens, scrims (papers), cloths, fabrics, and even single tows and filaments. Coating performance on two different base substrates are shown in Chart 1 in U.S. Provisional Patent Application, Ser. No. 62/357,904 that was filed on Jul. 1, 2016 for an invention titled METHODS AND SYSTEMS FOR CONSTRUCTING OR RETROFITTING ELECTROMAGNETICALLY SHIELDED FACILITIES (herein referred to as "Provisional Application"), which is hereby incorporated herein by this reference. The shielding effectiveness of a single layer has been demonstrated in the 60-80 db range. The paper may also be combined with other materials, incorporated into seam edges, applied by standard construction methods (i.e., with commercially available wallpaper adhesives or film adhesives), and then painted over or re-papered over to achieve a desired look. See Provisional Application, ¶ [0014] and FIG. 1.

When tested in standard consumer wireless (WiFi) frequencies, enclosures that use this shielding wallpaper are seen to shield 60 to 90 db across the frequency range. See Provisional Application, ¶ [0015] and Chart 1.

Several structures have been built and tested using exemplary shielding wallpaper of the present disclosure, including a portable stick-frame and wallboard (standard construction) room. WiFi signals from typical electronics (such as a laptop) are completely attenuated when placed in this shielded room. See Provisional Application, ¶ [0016] and Diagram 2.

For shielding integrity, the shielding wallpaper is hung so that edges overlap, leaving no open seam. Overlapping at floor and ceiling junctures also facilitates the shielding protection of an entire room or building structure. It should be understood that the shielding wallpaper may be hung with side edges abutting; but, to maintain shielding integrity, a shielding strip of tape or wallpaper material should straddle any possible gap in the seam formed by the abutting edges.

Although metal screens and meshes are known for window shielding applications, such shielding has drawbacks. Approaches, disclosed herein, have been developed for transparent, shielding window coverings that overcome drawbacks of metal screens and meshes. These new approaches for window coverings may again be engineered across a broad range, with various substrate (including organic screens) and layering options. The window shielding applications disclosed herein include an exemplary NiCVD coated screen of woven silk fibers. This material shows good optical transparency, and attenuates from 40 to 100 db, depending on frequency, as shown in Provisional Application at paragraph [0018] and Diagram 3. It should be understood that for such window shielding to be an effective shielded optical opening component of a shielded building structure, a shielding coupling (such as a conductive frame, overlapping edge portions or tabs of the NiCVD coated screen of woven silk fibers, or the like) would need to connect to the adjacent portion of shielding of the shielded building structure to maintain shielding continuity between the window shielding and the shielded building structure. When tested against typical consumer devices (enclosed within a surrounding sleeve of shielding screen), the transparent shielding screen shows that typical frequencies (cellular, WiFi, Bluetooth, and GPS) are completely attenuated. See Provisional Application, ¶ [0019] and Diagram 4.

Additional advanced materials are available from Conductive Composites Company and may be used provide a range of specialty construction materials. These materials are applicable to electro static discharge (ESD) sensitive applications, medical imaging, and certain shielding applications. Such products may be used in construction just as conventional materials, while incorporating the advantageous properties of isotropic conductivity and shielding. Specialty construction products include paints, sealants, adhesives, concretes, stucco, wallpaper, and all other types of construction materials.

Shielded flooring represents a challenge because floors are often subject to considerable foot traffic or vehicle or heavy equipment traffic. Although, the use of shielded wallpaper between subfloors may prove suitable for some facilities, a more physically robust alternative may be required to achieve the level of shielding needed. Where more robust material is needed, an exemplary three-layered combination of Kevlar non-woven as a base layer, nickel-coated non-woven as the intermediate layer, and a precision-chopped fiber (PCF) toughened polymer may be used.

For purposes of this disclosure, PCF is a metal-coated fiber (such as a nickel-coated fiber) chopped to a specific length requirement so that when added to a polymer, elastomer, or paint the loaded polymer, elastomer, or paint can be applied by spraying, rolling, and/or brushing using conventional techniques. The PCF can be applied to wood or concrete subfloors by roller, brush, or spray. A single layer or multi-layered combination shielded flooring may be adhered to a subfloor's top surface with a second subfloor adhered to the shielded flooring so that the shielded flooring may be sandwiched between subfloors.

Where suitable, the ceiling in a room may be treated like a wall and have wallpaper hung on the ceiling. Where more robust protection is needed, wallpaper can be adhered to the ceiling structure above a dropped ceiling, for example, and then covered by the layered combinations described above or by a spray-on PCF toughened polymer. Of course, those skilled in the art armed with knowledge of the shielded construction materials disclosed herein may use those materials in other combinations to achieve the desired level of protection while maintaining shielding integrity.

For new construct or where suitable for a retrofit, the floor, walls or ceiling may be formed of a shielding concrete. Such shielding concrete may comprise 0.2 to 2.5% of nickel-coated carbon fiber, chopped to lengths of 1 mm to 12 mm and added to the concrete during mixing. With loads levels of 0.01% to 0.1% within the concrete will create an ESD shielding floor. Loading the concrete at approximately 1.5% will yield shielding at about 60 db for ¼" thickness, 66 db for ½" thickness, 72 db for 1" thickness, and 78 db for 2" thickness. Because a sharp corner to a room may serve as an antenna, the corners are preferably rounded. The shielded wallpapers of the present disclosure are particularly suitable because they are as flexible as most papers and may cover rounded corners easily. Further, the interfaces between floor and wall and between wall and ceiling may be spanned by overlapping or utilizing a transition shielding strip. An exemplary transition shielding strip may be made of a base layer of the shielding wallpaper (e.g. nickel-coated non-woven) with a PCF toughened polymer coating over a portion of the strip. The exemplary transition shielding strip may be disposed to straddle the interface generally at a bending line with the shielding wallpaper portion being adhered to the wall and the toughened polymer coated portion being adhered to the shielded flooring material (such as the three-layer combination described above) or shielded concrete.

These and other features of the exemplary embodiments of the present invention will become more fully apparent from the following description, or may be learned by the practice of the invention as set forth hereinafter.

BRIEF DESCRIPTION OF THE DRAWINGS

The exemplary embodiments of the present invention is described more fully hereinafter with reference to the accompanying drawings, in which one or more exemplary embodiments of the invention are shown. Like numbers used herein refer to like elements throughout. This invention may, however, be embodied in many different forms and should not be construed as limited to the embodiments set forth herein; rather, these embodiments are provided so that this disclosure will be operative, enabling, and complete. Accordingly, the particular arrangements disclosed are meant to be illustrative only and not limiting the scope of the invention, which is to be given the full breadth of the appended claims and any and all equivalents thereof. Moreover, many embodiments, such as adaptations, variations, modifications, and equivalent arrangements, will be implicitly disclosed by the embodiments described herein and fall within the scope of the present invention.

Although specific terms are employed herein, they are used in a generic and descriptive sense only and not for purposes of limitation. Unless otherwise expressly defined herein, such terms are intended to be given their broad ordinary and customary meaning not inconsistent with that applicable in the relevant industry and without restriction to any specific embodiment hereinafter described. As used herein, the article "a" is intended to include one or more items. Where only one item is intended, the term "one", "single", or similar language is used. When used herein to join a list of items, the term "or" denotes at least one of the items, but does not exclude a plurality of items of the list. Additionally, the terms "operator", "user", "officer", "soldier", and "individual" may be used interchangeably herein unless otherwise made clear from the context of the description.

Figure 4:
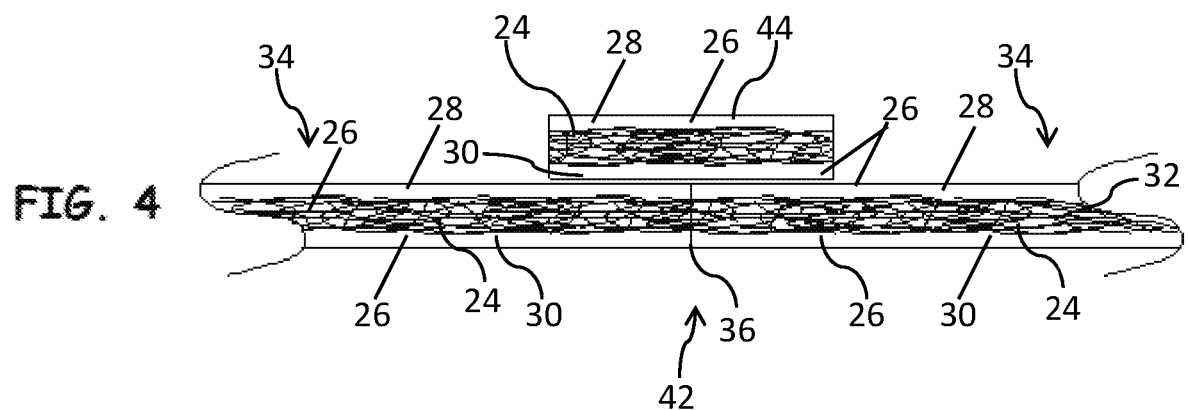
Figure 5:
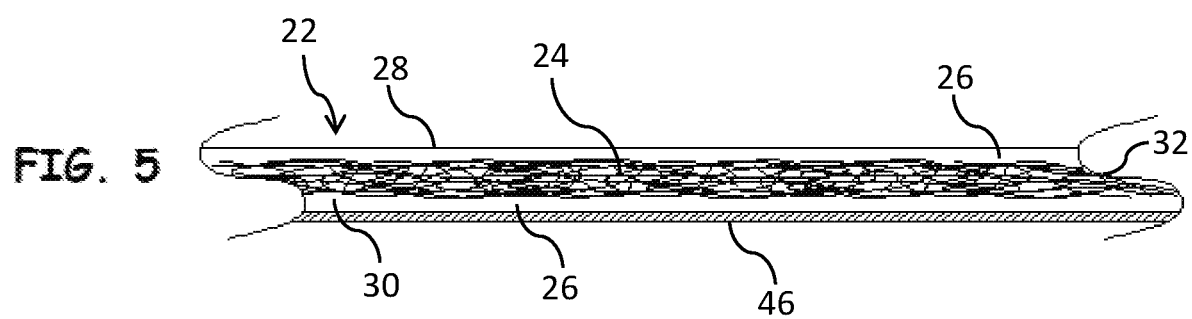
Figure 6:
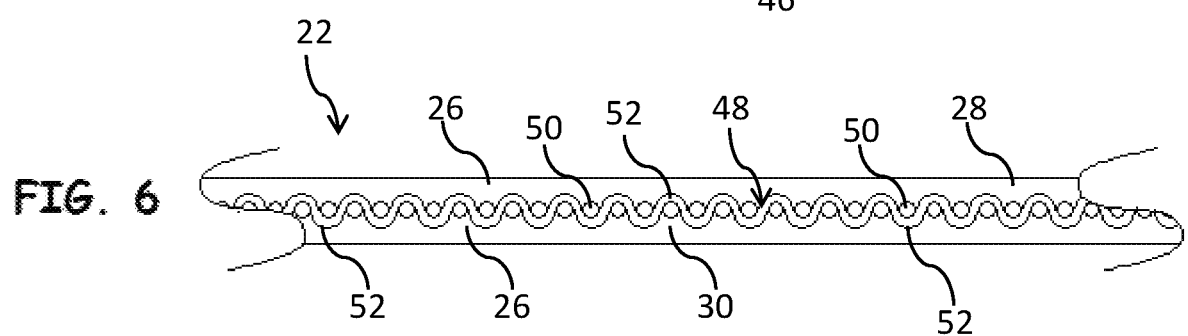
Figure 7:
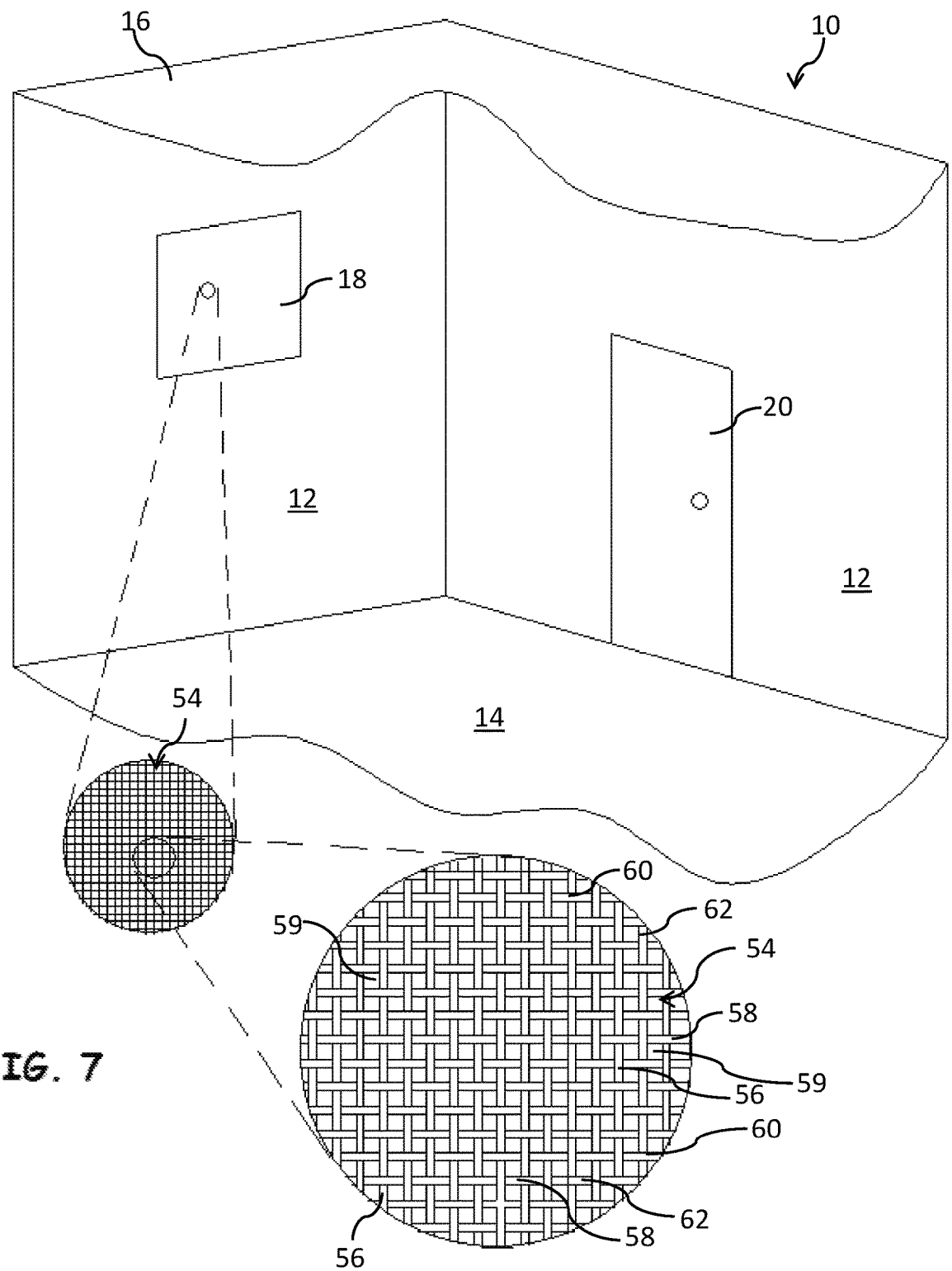
Figure 8:
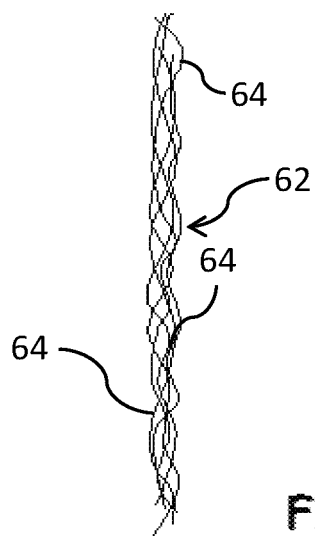
Figure 9:
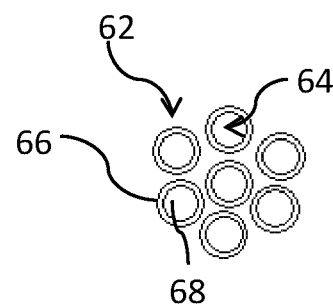
Figure 10:
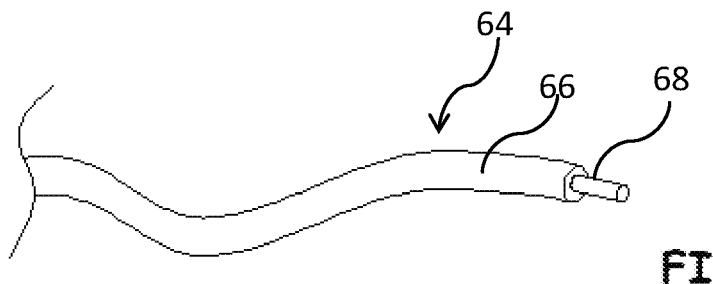
Figure 11:
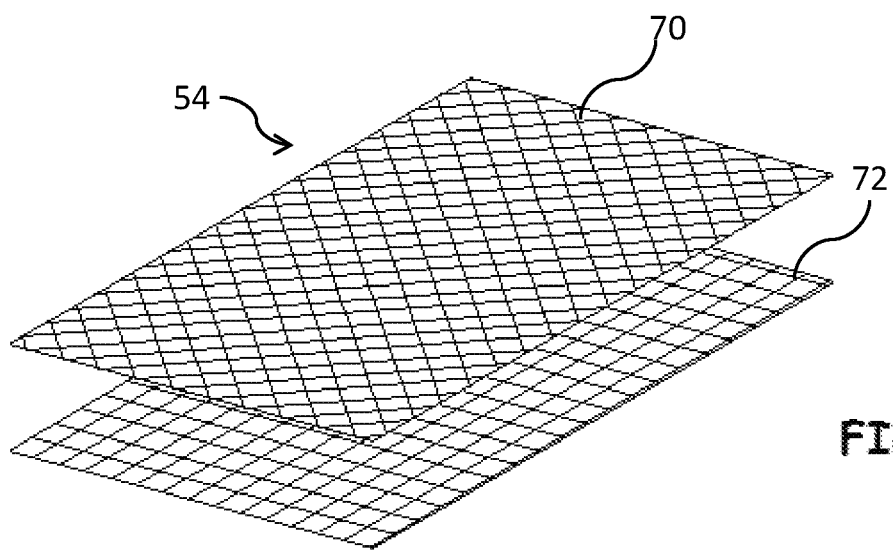
Figure 12:
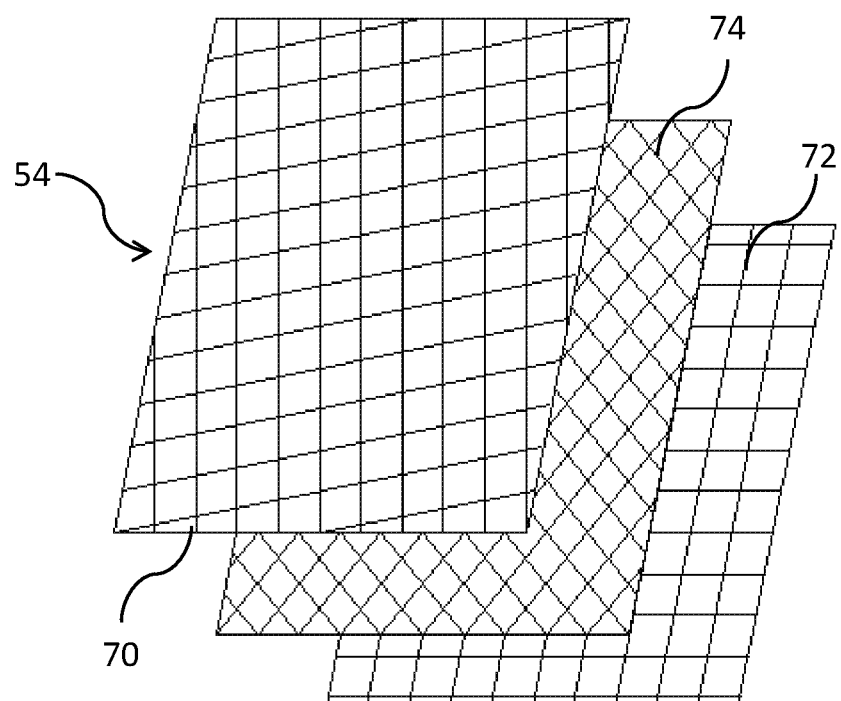
Figure 16:
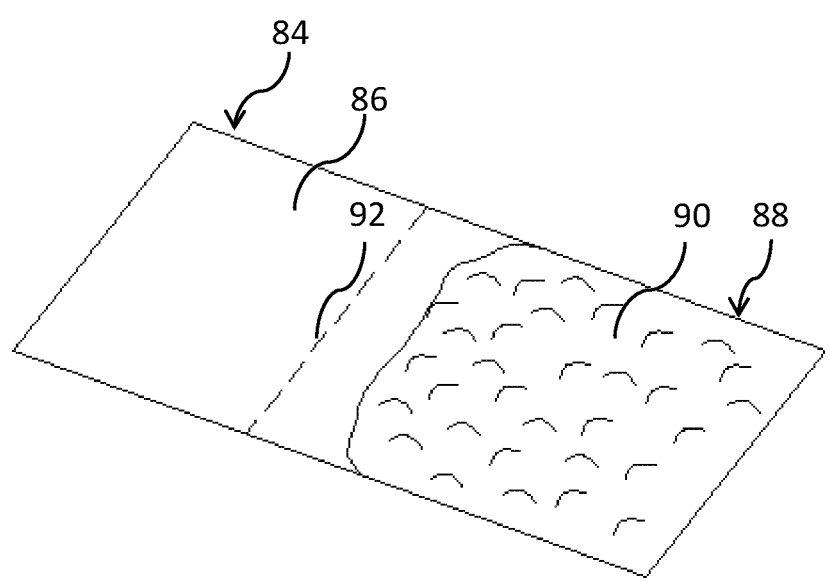
Figure 13:
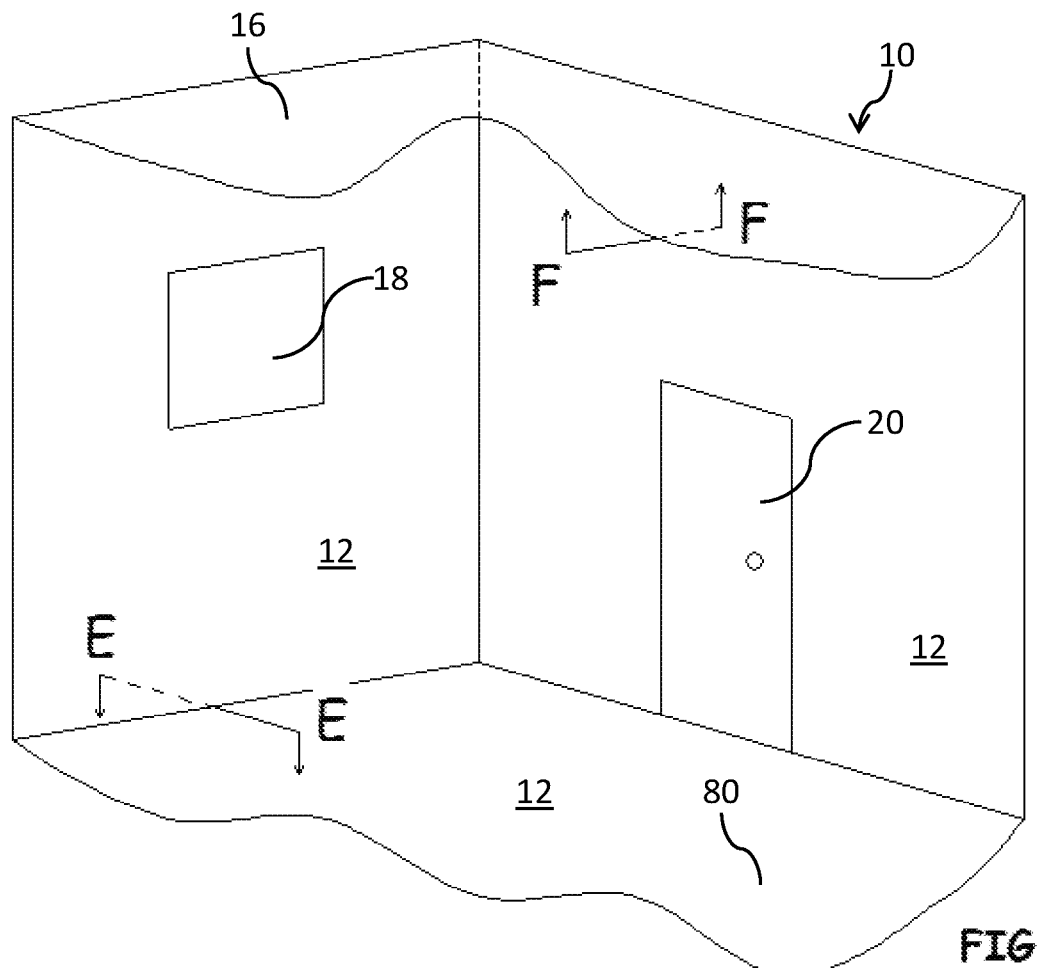
Figure 14:
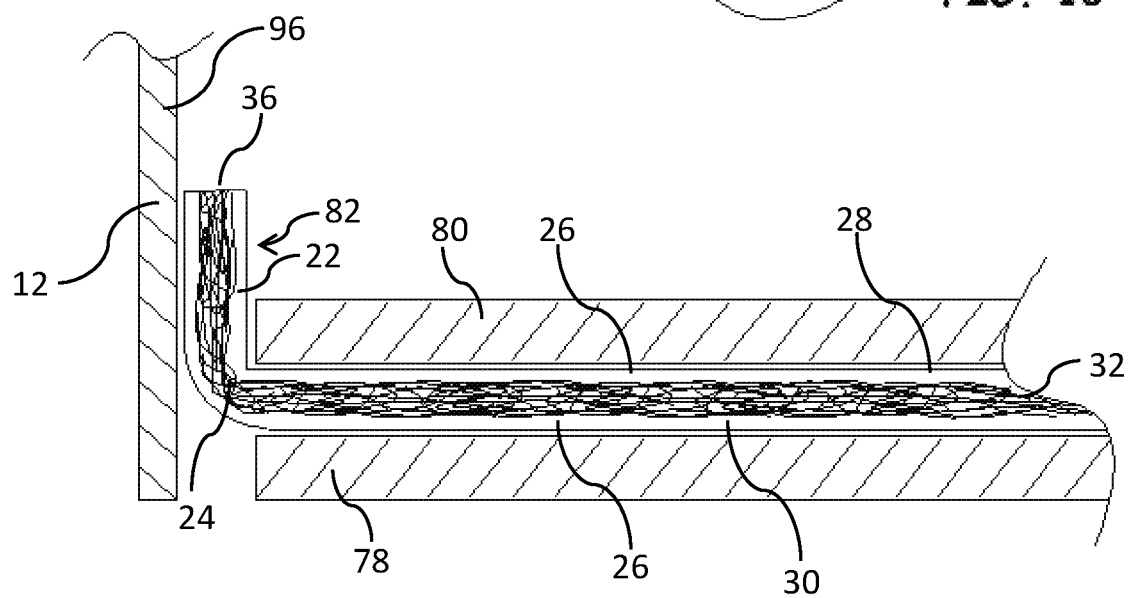
Figure 15:
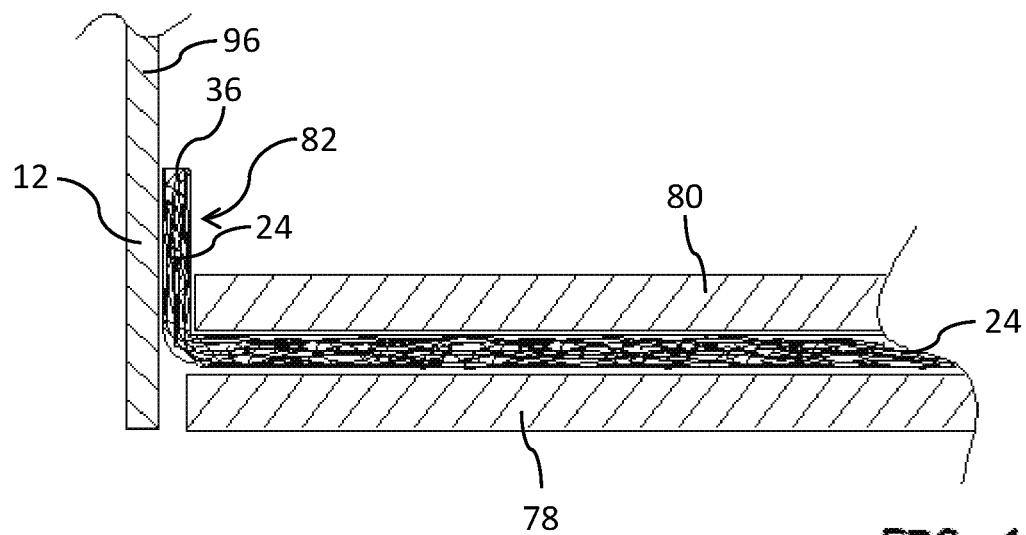
Figures 17A, 17B, 17C:
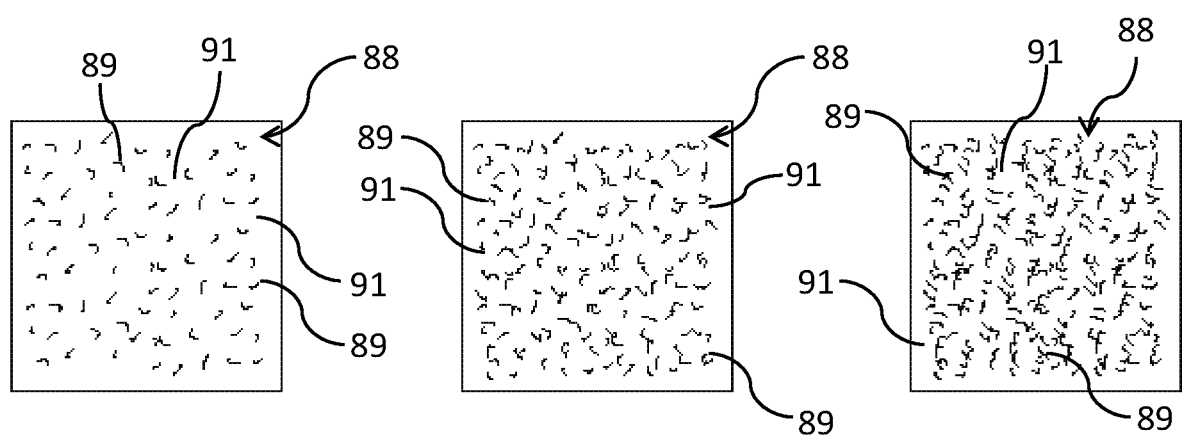

Understanding that these drawing(s) depict only typical exemplary embodiments of the invention and are not therefore to be considered to be limiting of its scope, the invention will be described and explained with additional specificity and detail through the use of the accompanying drawings in which:

FIG. 1 is a cut-away perspective view of an exemplary embodiment of a shielded room with walls, floor, ceiling, a window, and a door, including enlarged portions of circled areas on the walls;

FIG. 2 is a cross-section view of an exemplary embodiment of the shielded wallpaper of FIG. 1 along line A-A;

FIG. 3 is a cross-section view of an exemplary embodiment of the shielded wallpaper at an overlapping juncture shown in FIG. 1 along line B-B;

FIG. 4 is a cross-section view of an exemplary embodiment of the shielded wallpaper at an abutting juncture with a shielding strip in FIG. 1 along line C-C;

FIG. 5 is a cross-section view of an alternative exemplary embodiment of the shielded wallpaper of FIG. 1 along line A-A with an adhesive layer depicted on the inward side of the shielded wallpaper;

FIG. 6 is a cross-section view of another alternative exemplary embodiment of the shielded wallpaper of FIG. 1 along line A-A with a woven CVD coated substrate core;

FIG. 7 is a cut-away perspective view of an exemplary embodiment of a shielded room with walls, floor, ceiling, a window, and a door, including enlarged portions of a circled area on the window;

FIG. 8 is a top plan view of an exemplary embodiment of a portion of a single silk thread showing mutiple silk fibers intermingled to form the silk thread;

FIG. 9 is a cross-section view of the exemplary silk thread of FIG. 8 along line D-D;

FIG. 10 is a cut-away perspective view of an exemplary CVD coated silk fiber with a portion of the CVD coating stripped away to reveal the silk fiber;

FIG. 11 is an exploded, perspective view of an exemplary embodiment of a two-layer shielded silk screen showing the mesh of the overlaying layer rotated 45° from the subtending layer;

FIG. 12 is an exploded, perspective view of an exemplary embodiment of a three-layer shielded silk screen showing the mesh of the intermediate layer rotated 30° from the subtending layer and the overlying layer rotated 60° from the subtending layer;

FIG. 13 is a cut-away perspective view of an exemplary embodiment of a shielded room with walls, floor, ceiling, a window, and a door, including enlarged portions of circled areas at the floor to wall juncture and on the ceiling;

FIG. 14 is a cross-section view of an exemplary embodiment of the floor to wall juncture of FIG. 13 along line E-E;

FIG. 15 is a cross-section view of an alternative exemplary embodiment of the floor to wall juncture of FIG. 13 along line E-E;

FIG. 16 is a top plan view of an exemplary embodiment of a transition shielding strip;

FIGS. 17A-17-C is a series of cross-section views of three alternative embodiments of PCF-loaded shielding material, wherein FIG. 17A depicts a PCF-loaded shielding material with a first concentration of PCF dispersed within the material, FIG. 17B depicts a PCF-loaded shielding material with a second concentration of PCF (greater than the first concentration of PCF) dispersed within the material, and FIG. 17C depicts a PCF-loaded shielding material with a third concentration of PCF (greater than the second concentration of PCF) dispersed within the material.

Figure 18:
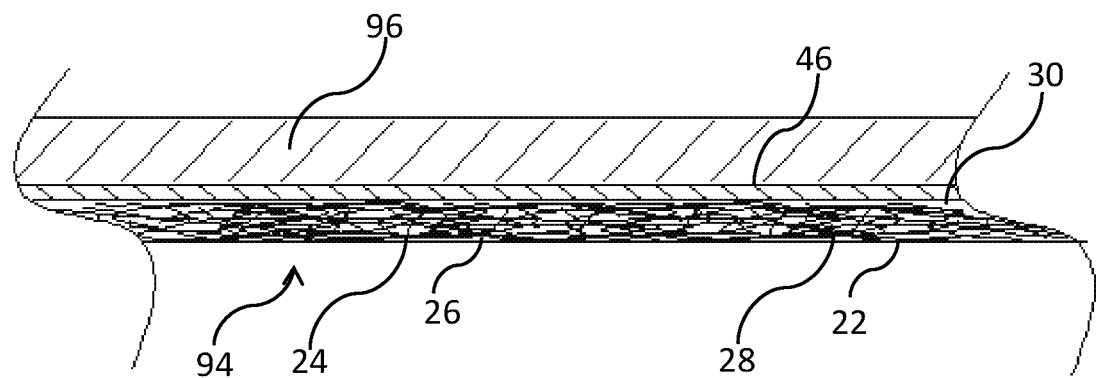
Figure 19:
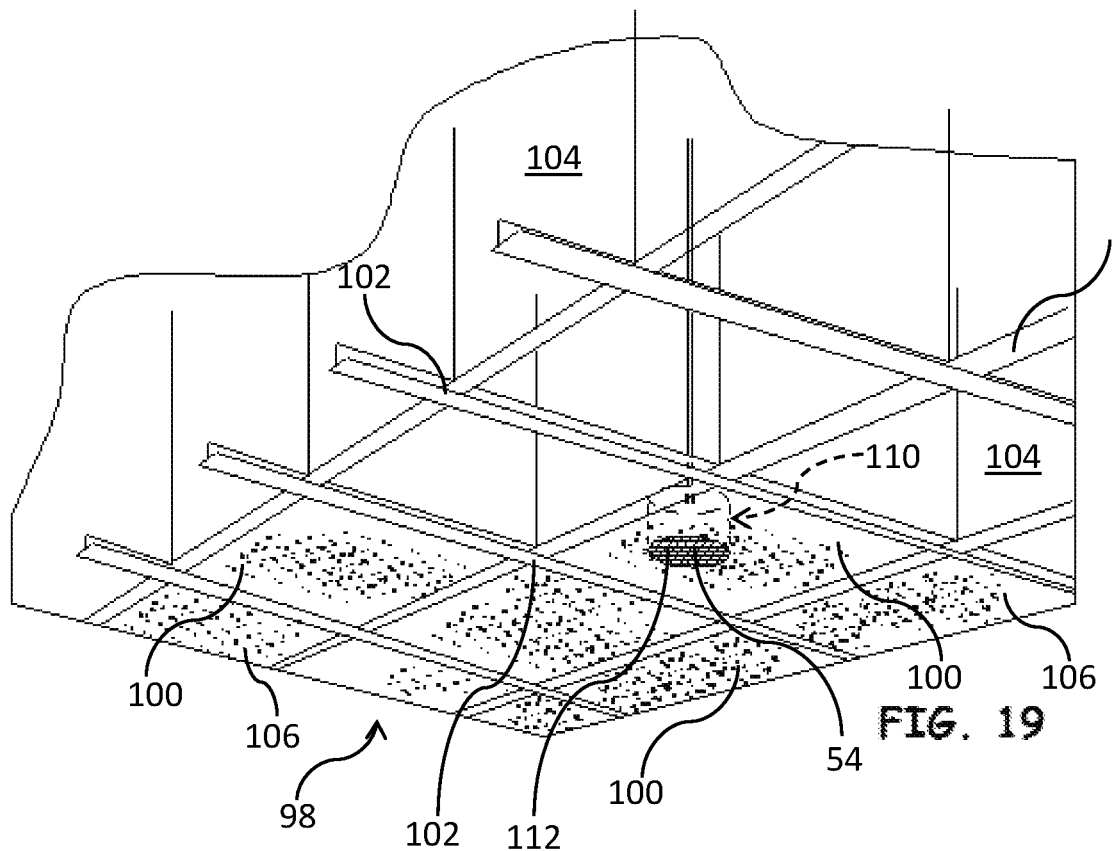
Figure 20:
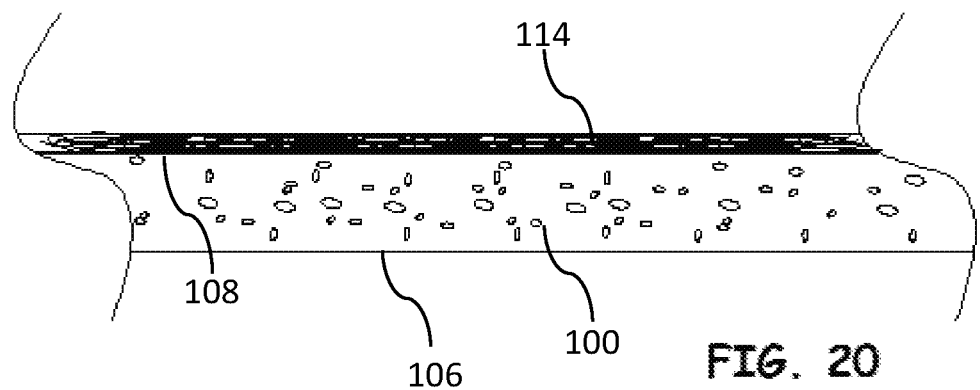
Figure 21:
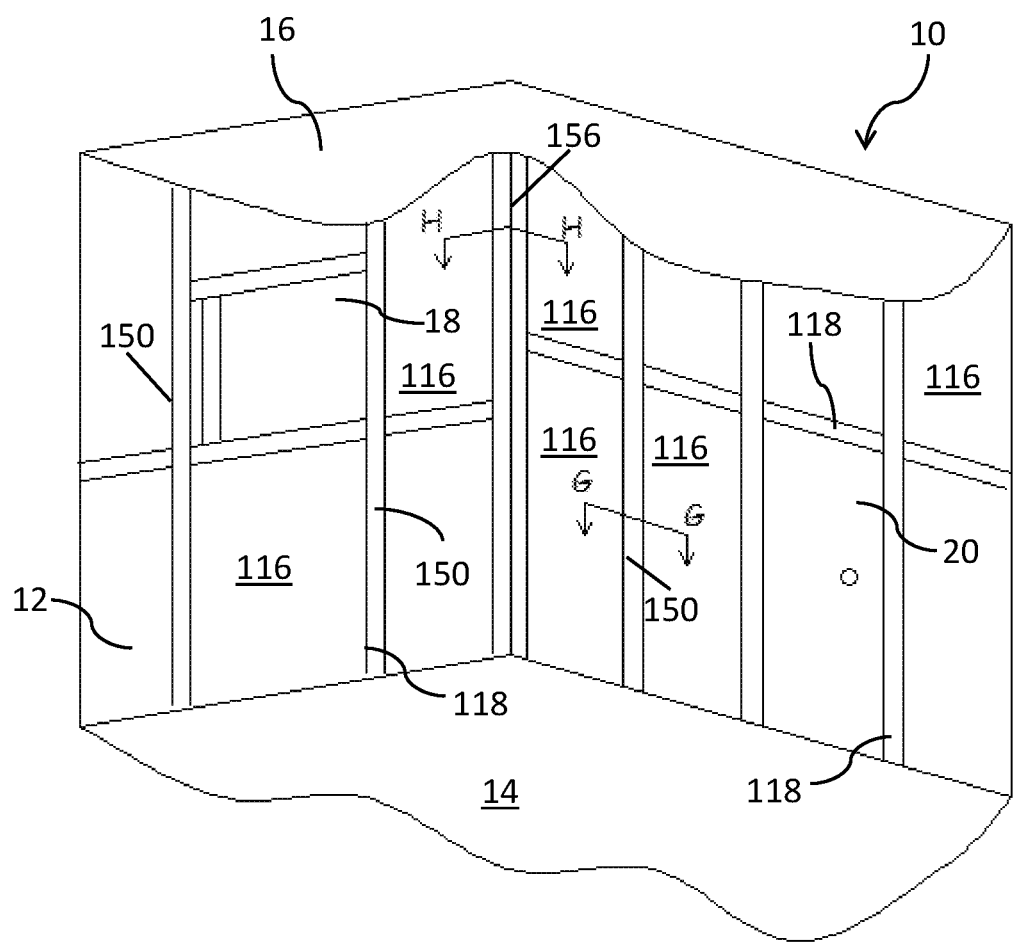
Figure 22:
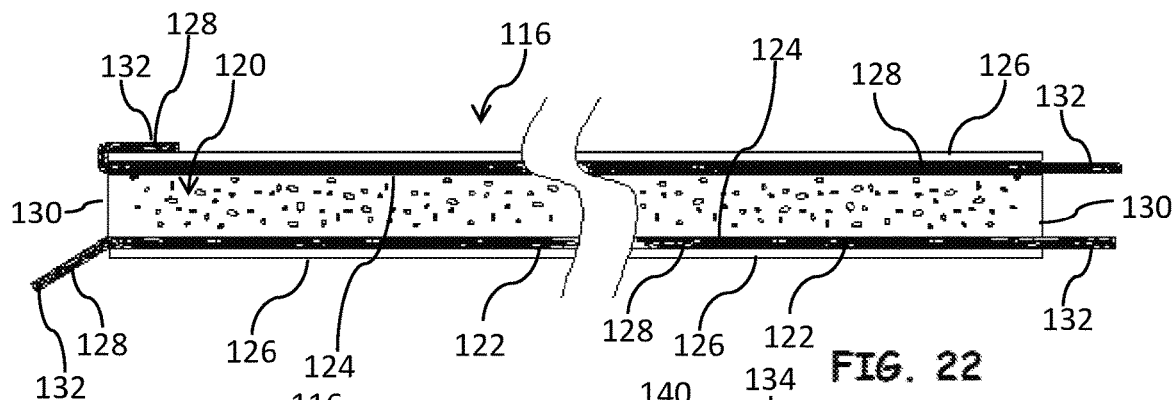
Figure 23:
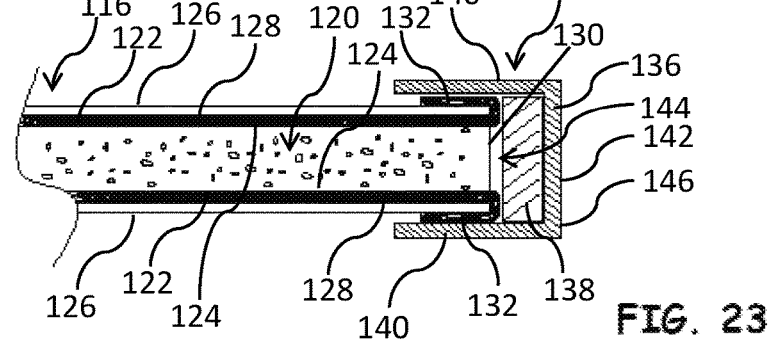
Figure 24:
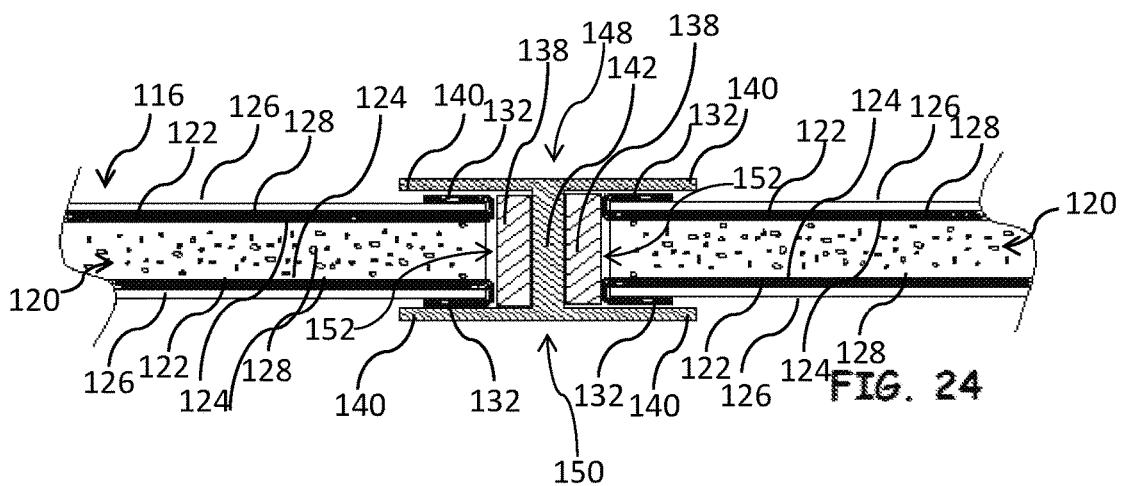
Figure 25:
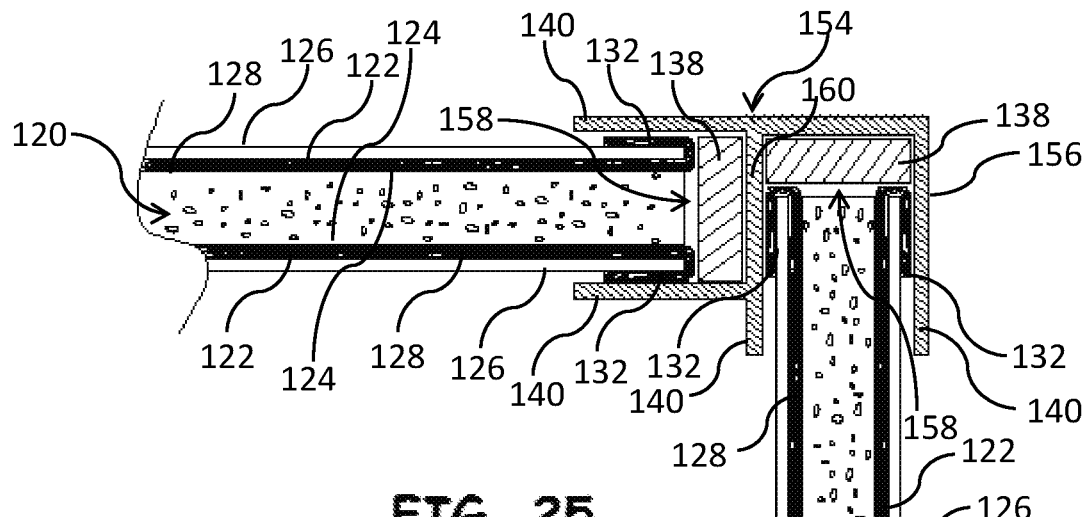
Figure 26:
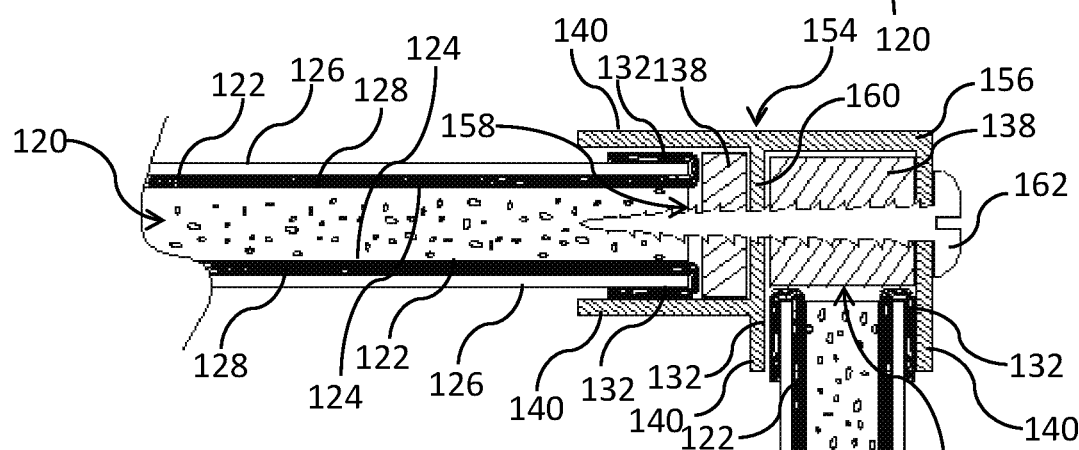

FIG. 18 is a cross-section view of an exemplary embodiment of the ceiling of FIG. 13 along line F-F;

FIG. 19 is a cut-away perspective view of an alternative exemplary embodiment of a shielded ceiling depicted as a suspended ceiling;

FIG. 20 is a cross-section view of an exemplary ceiling panel as depicted in FIG. 19, showing a shielding layer on the backside of the ceiling panel;

FIG. 21 is a cut-away perspective view of yet another exemplary embodiment of a shielded room with modular wall panels, floor, ceiling, a window, and a door;

FIG. 22 is a cross-section view of an exemplary embodiment of a modular wall panel;

FIG. 23 is a cross-section view of an exemplary embodiment of a shielded, modular wall panel and end bracket assembly;

FIG. 24 is a cross-section view of an exemplary embodiment of a panel-to-panel juncture of FIG. 21 along line G-G;

FIG. 25 is a cross-section view of an exemplary embodiment of a panel-to-panel corner juncture of FIG. 21 along line H-H; and FIG. 26 is a cross-section view of an alternative exemplary embodiment of a panel-to-panel corner juncture of FIG. 21 along line H-H.

REFERENCE NUMERALS shielded room 10
walls 12
floor 14
ceiling 16
window 18
door 20
shielded wallpaper 22
metal-CVD coated substrate core 24
resin 26
obverse layer 28
reverse layer 30
intermediate layer 32
sheet(s) 34
longitudinal edge(s) 36
end edge(s) 38
overlapping juncture 40
abutting juncture 42
shielding strip 44
adhesive layer 46
woven metal-CVD coated substrate core 48
warp thread(s) (woven wallpaper) 50
weft thread(s) (woven wallpaper) 52
shielded covering 54
warp thread(s) (shielded covering) 56
weft thread(s) (shielded covering) 58
interstices 59
organic fibers 60
NiCVD coated silk thread 62
coated silk fibers 64
CVD coating 66
uncoated silk fiber 68
overlying layer 70
subtending layer 72
intermediate layer 74
floor-to-wall juncture 76
base subfloor 78
overlaying subfloor 80
edge portion 82
transition shielding strip 84
base layer 86
PCF-loaded material 88
PCF (precision chopped fiber) 89
PCF-toughened polymer coating 90
material 91
bending line 92
shielded ceiling 94
drywall 96
suspended ceiling 98
ceiling panel(s) 100
suspended framework 102
support ceiling 104
front side 106
backside 108
recessed light fixture 110
opening 112
shielding layer 114
modular wall panel 116
connecting brackets 118
core 120
panel shielding layer 122
face 124
outer skin 126
NiCVD coated nonwoven paper 128
side edges 130
wrap-around flap 132
end bracket assembly 134
metal channel 136
spacer 138
legs 140 web 142
channel 144
outer face 146
panel-to-panel juncture 148
H-shaped bracket assembly 150
dual metal channels 152
panel-to-panel corner juncture 154
angled bracket assembly 156
angled channel(s) 158
common portion 160
anchoring screw 162

DETAILED DESCRIPTION OF THE INVENTION

The exemplary embodiments of the present disclosure will be best understood by reference to the drawings, wherein like parts are designated by like numerals throughout. It will be readily understood that the components of the exemplary embodiments of the present invention, as generally described and illustrated in the figures herein, could be arranged and designed in a wide variety of different configurations. Thus, the following more detailed description of the exemplary embodiments, as represented in the Figures, is not intended to limit the scope of the invention, as claimed, but is merely representative of exemplary embodiments of the disclosure.

In this application, the phrases "connected to", "coupled to", and "in communication with" refer to any form of interaction between two or more entities, including mechanical, capillary, electrical, magnetic, electromagnetic, pneumatic, hydraulic, fluidic, and thermal interactions.

The phrases "attached to", "secured to", and "mounted to" refer to a form of mechanical coupling that restricts relative translation or rotation between the attached, secured, or mounted objects, respectively. The phrase "slidably attached to" refer to a form of mechanical coupling that permits relative translation, respectively, while restricting other relative motions. The phrase "attached directly to" refers to a form of securement in which the secured items are in direct contact and retained in that state of securement.

The term "abut" and its formatives including "abutting" refers to items that are in direct physical contact with each other, although the items may not be attached together. The term "grip" refers to items that are in direct physical contact with one of the items firmly holding the other. The term "integrally formed" refers to a body that is manufactured as a single piece, without requiring the assembly of constituent elements. Multiple elements may be integrally formed with each other, when attached directly to each other from a single work piece. Thus, elements that are "coupled to" each other may be formed together as a single piece.

The term "intermingle" and its formatives including "intermingling" and "intermingled" refers to items that are in longitudinal association with each other, although the items may or may not be twisted together or braided together. For example, a number of silk fibers may be intermingled to form a silk thread even though the fibers are not twisted together or braided together. However, silk fibers are intermingled to form the silk thread even if twisted or braided. Hence, for this application, all twisted or braided fibers that form a thread are intermingled even though not all intermingled fibers are twisted or braided.

Herein, the acronym "CVD" means chemical vapor deposition and the acronym "PCF" means precision chopped fiber. Precision chopped fiber includes fibers chopped to short, precise millimeter and sub-millimeter lengths, and may be coated or non-coated. Typically, they are a conductive additive to paints, gaskets, sealants, molding compounds, adhesives, mortar-based materials, and the like to enhance the conductivity of the product to which they are added. PCF is an off-the shelf product available from Conductive Composites Company, but may also be obtained from any number of fiber converters such as Engineered Fiber Technology, LLC in Shelton, Conn.

The term "organic" refers to a class of chemical compounds that includes those existing in or derived from plants or animals and also includes compounds of carbon.

The term "optical opening" includes any opening intended to permit the passage of light into a building structure, including windows, glass doors, side lights, skylights, portholes, clearstory windows, and the like.

FIG. 1 is a cut-away perspective view of an exemplary embodiment of a shielded room 10 with walls 12, a floor 14, a ceiling 16, a window 18, and a door 20, including enlarged portions of circled areas on the walls 12. A shielded room 10 may be achieved by utilizing one or more of several unique shielding products as disclosed and described herein either with or without known shielding products or techniques.

FIG. 2 is a cross-section view of an exemplary embodiment of shielded wallpaper 22 of FIG. 1 along line A-A. As depicted in the magnified cross-section, the exemplary shielded wallpaper 22 comprises a metal-CVD coated substrate core 24 that is impregnated by resin 26. The resin 26 in the depicted embodiment has an impregnating portion and also forms an obverse layer 28 and a reverse layer 30 of resin 26 only, and an intermediate layer 32 comprised of the resin-impregnated (the impregnating portion) metal-CVD coated substrate core 24. With this configuration, not only does the resin 26 add strength and durability to the metal-CVD coated substrate core 24, but it also seals the metal-CVD coating or the substrate core 24 from corrosion while creating vapor impermeability and maintaining the shielding capability of the shielded wallpaper 22. It should be understood that the obverse layer 28 and reverse layer 30 may each be very thin (i.e, sufficient to seal metal-CVD coated substrate core 24). The depictions of the obverse layer 28 and reverse layer 30 in the drawings have exaggerated thickness only for illustration and disclosure purposes.

The metals used in the metal-CVD coated substrate core 24 may be any of a number of known conductive metals such as gold, silver, nickel, aluminum, copper, etc. and alloys of those metals. The type of metal or alloy used may be selected to achieve desired levels of conductivity or to be more cost and/or weight effective. Although nickel may be less conductive than other metals, nickel is sufficiently conductive, less-corrosive, available in quantity, less expensive, and significantly higher in magnetic permeability than many other suitable metals and alloys. For those reasons, this disclosure will focus on the use of NiCVD. However, it should be understood that other metal-CVD is contemplated by this disclosure and falls within the spirit and scope of this invention because, armed with this disclosure, those skilled in the art will know and understand how to make and use other metal-CVD coated substrate cores.

As depicted in FIG. 2, the metal-CVD coated substrate core 24 is porous so that coated surface of the substrate core is much greater than would be the case with a non-porous substrate or even coated individual fibers. Additionally, with coated individual fibers the continuity of the conductivity throughout the core is compromised. In FIG. 2, the porosity of the metal-CVD coated substrate core 24 is somewhat accentuated for illustrative reasons. As reflected in FIGS. 22-26, a lesser porosity is depicted to illustrate an alternative embodiment where the porosity affects the amount of coated surface which also affects the amount of metal used and the shielding level that may be achieved.

The metal-CVD coated substrate core 24 may utilize various types of non-metal substrates, including polymeric substrates such a Kevlar, or organic substrates such as carbon fibers or cellulose. However, Kevlar has such tightly knitted molecules and is expensive and carbon fibers, though less costly than Kevlar, are significantly more expensive than other organic materials such as cellulose. Hence, Kevlar and carbon fibers may be less suitable that cost-effective organic materials like cellulose. For exemplary disclosure purposes, the cores depicted in FIGS. 1-5, 14, 15, 18, 20, and 22-26 are a NiCVD coated nonwoven cellulose paper substrate. It should be understood, however, that those skilled in the art armed with this disclosure could make and use various metal-CVD coated substrate cores 24 without departing from the spirit and scope of this invention.

Much like traditional wallpaper, the shielded wallpaper 22 may be made in sheets 34 that may be rolled up for storage and transport. Such sheets 34 have longitudinal edges 36 and may be cut to length, creating end edges 38. To maintain shielding continuity, when hanging the shielded wallpaper 22 edges 36, 38 may be overlapped to facilitate the complete coverage of a wall 12 of shielding capability. FIG. 3 is a cross-section view of an exemplary embodiment of the shielded wallpaper 22 at an overlapping juncture 40 shown in FIG. 1 along line B-B. The overlapping, as shown, may be sealed in the same fashion as the shielded wallpaper 22 is connected to the wall 12 (e.g., by paste, adhesive, or on-site wet resin lay-up as described herein).

The shielded wallpaper 22 may be constructed during application to the wall 12, door 20, ceiling 16, or floor 14 using an on-site wet lay-up process because the resin 26 used to seal the metal-CVD coated substrate core 24 from corrosion may also act as an adhesive to secure the shielded wallpaper 22 to a wall 12, door 20, ceiling 16, or floor 14 when applied wet and allowed to dry in place. Hence, preparing on-site a shielded wallpaper 22 for connection to a wall 12, for example, comprises impregnating the metal-CVD coated substrate core with a hardening resin 26 while still wet to form an obverse layer 28 and a reverse layer 30 of the hardening resin 26, and applying the resin 26 wet shielded wallpaper 22 to the wall 12 in adhering engagement pressing the reverse layer 30 of resin 26, while still wet, against the wall 12 to dry into an adhering engagement.

FIG. 4 is a cross-section view of an exemplary embodiment of the shielded wallpaper 22 at an abutting juncture 42 with a shielding strip 44 (such as a shielding seam tape) disposed to overlay the abutting juncture 42. Again, to maintain shielding continuity, when hanging the shielded wallpaper 22 edges 36, 38 may abut so long as a shielding strip 44 covers the abutment of the edges 36, 38. The shielding strip 44 may be an elongate strip of the same configuration as the shielded wallpaper 22, as shown in FIG. 4, or any other suitable strip of shielding material that will not compromise the integrity of the shielding at the abutment.

FIG. 5 is a cross-section view of an alternative exemplary embodiment of the shielded wallpaper of FIG. 1 along line A-A with an adhesive layer 46 depicted as disposed on the reverse layer 30 of the shielded wallpaper 22. The adhesive layer 46 may comprise any suitable paste, adhesive film, or resinous penetrating adhesive, and may be conductive or non-conductive. By way of example, and not to be restrictive, traditional wallpaper paste, adhesive film, resinous penetrating adhesive such as E6000 adhesive or Gorilla glue, a roll-on or a spray adhesive like 3M Super 77, vinyl tile adhesives, urethane-based polymers, and the like may be effectively be used as an adhesive layer 46.

FIG. 6 is a cross-section view of another alternative exemplary embodiment of the shielded wallpaper 22 of FIG. 1 along line A-A depicting a woven metal-CVD coated mesh core 48. The alternative exemplary shielded wallpaper 22 comprises a metal-CVD coated mesh core 48 that is impregnated by resin 26, filling the interstices between the non-metal warp and weft threads 50, 52, sealing the metal-CVD coated mesh core 48 and making it vapor impermeable and non-corrosive. The resin 26 in the depicted alternative embodiment also forms an obverse layer 28 and a reverse layer 30 of resin 26 only, and an intermediate layer 32 comprised of the resin-impregnated metal-CVD coated mesh core 48.

FIG. 7 is another cut-away perspective view of an exemplary embodiment of a shielded room 10 with walls 12, floor 14, ceiling 16, an optical opening such as window 18, and a door 20, including enlarged portions of a circled area on the window 18. The first enlargement or magnification illustrates that the window 18 is overlaid with a diaphanous shielded covering 54, and the second enlargement or magnification more clearly illustrates the warp threads 56, weft threads 58, and interstices 59 between the threads 56, 58 of the shielded covering 54. Each of the warp and weft threads 56, 58 may be comprised of organic fibers 60 that are intermingled to form a thread 56, 58. The mesh made of the organic, woven warp and weft threads 56, 58 may be metal-CVD coated, such as by NiCVD.

Again, it should be understood that for such shielded covering to be an effective shielded optical opening component of a shielded building structure 10, a shielding coupling (such as a conductive frame, overlapping edge portions or tabs of the NiCVD coated screen of woven silk fibers, or the like) would need to connect to the adjacent portion of shielding of the shielded building structure 10 to maintain shielding continuity between the shielded covering 54 and the shielded building structure 10.

In order to preserve and maximize the degree of transparency through the window 18, the resin 26 filling the interstices between the warp and weft threads 56, 58 and sealing the diaphanous shielded covering 54 against corrosion is clear, allowing the passage of light through the resin 26. By using a transparent resin 26 to fill the interstices 59 and to cover all surfaces of the shielded covering 54, the metal is toughened and protected against corrosion. Although this is one protection feature that may be used protect the delicate coated screen of fibers of the shielded covering, there are other protection features that may be implemented. For example, the shielded covering may be placed against an optical opening and covered by a barrier of glass or transparent polymeric material, or the metal-coated woven substrate of the shielded covering may be encased in or sandwiched between glass barriers or barriers of transparent polymeric material. Armed with this disclosure, those skilled in the art will understand that there are other ways to protect and strengthen the shielded covering 54 while maintaining shielded continuity across the interface between the shielded covering 54 and any adjacent portion of the shielded building structure 10. Each such protection features are contemplated and should be understood to be within the scope and spirit of this invention.

FIG. 8 is a top plan view of an exemplary embodiment of a portion of an expanded single NiCVD coated silk thread 62 showing multiple coated silk fibers 64 intermingled to form the silk thread 62. The coated silk fibers 64 shown are limited in number and spatially expanded to illustrate that the intermingling of the fibers 64 need not be twisted or braided. However, it should be understood the fibers 64 may be twisted or braided and still be intermingled. FIG. 9 is a cross-section view of the exemplary silk thread 62 of FIG. 8 along line D-D, and shows the NiCVD coating of each individual silk fiber 64. FIG. 10 is a cut-away perspective view of an exemplary NiCVD coated silk fiber 64 with a portion of the CVD coating 66 stripped away to reveal the uncoated silk fiber 68. Although the silk fiber 68 is disclosed herein and has certain advantages of strength, durability, availability, and being lightweight and inexpensive, it should be understood that other non-metal fibers may also be used suitably, whether organic or not.

FIG. 11 is an exploded, perspective view of an exemplary embodiment of a two-layer shielded covering 54 showing the mesh of the overlaying layer 70 rotated 45° from the subtending layer 72. With this exemplary embodiment, the shielding effectiveness is increased significantly with minimal effect on the transparency. Similarly, FIG. 12 is an exploded, perspective view of another exemplary embodiment of a three-layer shielded covering 54 showing the mesh of the intermediate layer 74 rotated 30° from the subtending layer 72 and the overlying layer 70 rotated 60° from the subtending layer 72. Again, the shielding effectiveness is increased significantly with minimal effect on the transparency. For example, with a single layer NiCVD coated silk mesh shielded covering 54, transparency is about 50% of an un-shielded window and delivers about 70 db of shielding, while a two-layer shielded covering 54 having the overlaying layer rotated 45° from the subtending layer 72 has transparency of about 40% and shielding of about 90 db, and the three-layer shielded covering 54 having the intermediate layer 74 rotated 30° from the subtending layer 72 and the overlying layer 70 rotated 60° from the subtending layer 72 has about 30% transparency and shielding of about 110 db.

The shielded covering 54 may be utilized to shield any light fixture (see FIG. 19 for example) or any optical opening, including any opening intended to permit the passage of light into a building structure or into a room such as, by way of example and not by limitation, windows, glass doors, side lights, skylights, portholes, clearstory windows, and the like. For such shielded covering 54 to be an effective shielded optical opening component of a shielded building structure 10, a shielding coupling (such as a conductive frame (see Example 3 in the text above and FIG. 21 for example), overlapping edge portions or tabs of the NiCVD coated screen of woven silk fibers (see FIGS. 23-26 for examples of overlapping edges or tabs connecting to conductive structure), or the like) would need to connect to the adjacent portion of shielding of the shielded building structure 10 to maintain shielding continuity between the shielded covering 54 and the shielded building structure 10. Of course, those skilled in the art, armed with this disclosure would know how to fashion shielded couplings that would effectively connect a shielded covering 54 to a shielded building structure 10 to maintain shielding continuity for the shielding covering 54 to the shielded building structure 10.

Turning now to FIGS. 13-15, a cut-away perspective view of an exemplary embodiment of a shielded room 10 is shown with walls 12, floor 14, ceiling 16, a window 18, and a door 20, including cross sections of the enlarged portions of circled areas at the floor-to-wall juncture 76 and on the ceiling 16. FIG. 14 is a cross-section view of an exemplary embodiment of the floor-to-wall juncture 76 of FIG. 13 along line E-E. With this exemplary embodiment, shielded wallpaper 22 (as described above) is sandwiched between a base subfloor 78 and an overlaying subfloor 80 with an edge portion 82 angled to run up and along wall 12. This edge portion 82 may then be overlapped by an end edge 38 of shielded wallpaper 22 to create an overlapping juncture 40 in a fashion as shown in FIG. 3 or abut with an end edge 38 of shielded wallpaper 22 with a shielded strip 44 covering the abutting juncture 42 in a fashion as shown in FIG. 4. By connecting the shielded wallpaper 22 in either of these ways, the shielding conductivity is continuous through the floor-to-wall juncture 76.

FIG. 15 shows a cross-section view of an alternative exemplary embodiment of the floor-to-wall juncture of FIG. 13 along line E-E, where the NiCVD coated substrate core is sandwiched between a base subfloor 78 and an overlaying subfloor 80 with an edge portion 82 angled to run up and along wall 12. Similarly, to maintain continuous shielding through the floor-to-wall juncture 76, the edge portion 82 may then be overlapped by an end edge 38 of shielded wallpaper 22 to create an overlapping juncture 40 in a fashion as shown in FIG. 3 or abut with an end edge 38 of shielded wallpaper 22 with a shielded strip 44 covering the abutting juncture 42 in a fashion as shown in FIG. 4.

Though not specifically shown, shielding may be enhanced by coating the base subfloor 78 and/or the overlaying subfloor 80 with a PCF-loaded material such as a polymer, elastomer, or paint. An example of PCF-loaded material 88 is depicted in FIG. 16.

FIG. 16 is a top plan view of an exemplary embodiment of a transition shielding strip 84 to be used as an alternative method for shielding through the floor-to-wall juncture 76. An exemplary transition shielding strip 84 may be made of a base layer 86 of the shielding wallpaper 22 or a metal-CVD coated substrate core 24 (e.g., nickel-coated nonwoven) with a PCF-loaded material 88 such as a PCF-toughened polymer coating 90 over a portion of the base layer 86. The exemplary transition shielding strip 84 may be disposed to straddle the floor-to-wall juncture 76 or any other angular interface generally at a bending line 92 with the shielding wallpaper 22 portion being adhered to the wall 12 and the PCF-toughened polymer coating 90 portion being adhered to the shielded flooring material (such as the subfloor/shielding wallpaper 22 or metal-CVD coated substrate core 24 combinations described above) or shielded concrete (described below).

FIGS. 17A-17-C is a series of cross-section views of three alternative embodiments of PCF-loaded shielding material 88, wherein FIG. 17A depicts a PCF-loaded shielding material 88 with a first concentration of PCF 89 dispersed within the material 91, FIG. 17B depicts a PCF-loaded shielding material 88 with a second concentration of PCF 89 (greater than the first concentration of PCF) dispersed within the material 91, and FIG. 17C depicts a PCF-loaded shielding material 88 with a third concentration of PCF 89 (greater than the second concentration of PCF) dispersed within the material 89. For the sake of brevity, the PCF-loaded shielding material 88 depicted in FIGS. 17A-17-C may comprise one of several different kinds of material 91 (the drawings are essentially the same for each type of material 91). For example, the PCF-loaded shielding material 88 may be a PCF-loaded polymer (such as PCF-toughened polymer coating 90), a PCF-loaded elastomer, a PCF-loaded adhesive, a PCF-loaded sealant, a PCF-loaded paint, a PCF-loaded mortar-based materials such as concrete, mortar, or stucco, or any combination of such materials 91. As a consequence, the type of PCF-loaded material 88 used may depend on the function(s) the PCF-loaded material 86 is to perform. A PCF-toughened polymer coating 90 might be used where foot traffic might damage a less robust form of shielding, or a PCF-loaded paint might be used to cover shielded wallpaper 22 or a door 20, for example.

Depending on the particular shielding need, on whether the project is a retrofit situation or new construction, and on cost and/or practicality factors, the use of PCF-loaded shielding material 88 may be used where shielding wallpaper 22 or shielded coverings 24 are absent or the PCF-loaded shielding material 88 may be used to augment the shielding effectiveness of shielding wallpaper 22 or shielded coverings 24.

For example, in a new construction situation, PCF-loaded concrete may be an effective as a shielded subfloor by itself or upon which shielded flooring or a PCF-toughened polymer coating 90 may be added. In some embodiments PCF-loaded concrete may be used as walls or as ceilings for a structure. In some embodiments, shielding concrete may comprise 0.2 to 2.5% of nickel-coated carbon fiber, chopped to lengths of 1 mm to 12 mm and added to the concrete during mixing. With loads levels of 0.01% to 0.1% within the concrete, the shielded concrete may be used for an ESD shielding floor. Loading the concrete at approximately 1.5% will yield shielding at about 60 db for ¼" thickness, 66 db for ½" thickness, 72 db for 1" thickness, and 78 db for 2" thickness.

FIG. 18 is a cross-section view of an exemplary embodiment of a shielded ceiling 94 of FIG. 13 along line F-F, and depicts a ceiling 16 constructed of drywall 96 such as Sheetrock with a shielded wallpaper 22 (or metal-CVD coated substrate core 24) affixed thereto using an adhesive layer 46. This exemplary embodiment is particularly useful for a retrofit to convert an existing drywall 96 ceiling 16 in a shielded ceiling 94. However, this embodiment could also be used for a new construction situation.

Other types of shielded ceilings 94 are contemplated by this disclosure. FIG. 19 is a cut-away perspective view of an alternative exemplary embodiment of a shielded ceiling 94 depicted as a suspended ceiling 98 with ceiling panels 100 and a suspended framework 102 for holding the ceiling panels 100 suspended from the support ceiling 104. With a suspended ceiling 98, shielding may be introduced in several different ways, each of which may be adequate alone or depending on the desired level of shielding may be combined to increase shielding capability.

One form of shielding for the ceiling 16 may be to roll, brush, or spray a PCF-loaded polymer (such as PCF-toughened polymer coating 90), PCF-loaded sealant, or a PCF-loaded paint onto the support ceiling 104. FIG. 19 depicts a PCF-toughened polymer coating 90 as sprayed onto the support ceiling 104. Another form of shielding for the ceiling is to paint the front side 106 or the backside 108 of each ceiling panel 100 with a PCF-loaded paint.

FIG. 19 also depicts a recessed light fixture 110 set in an opening 112 in one of the ceiling panels 100. To provide shielding and not to overly attenuate the delivery of light into the shielded room 10, a shielded covering 54 spans and covers the area of the opening 112. Similarly, other types of light fixtures or ceiling interruptions may be shielded using one or more of the shielding products or techniques described herein.

FIG. 20, a cross-section view of an exemplary ceiling panel 100, depicts yet another form of shielding for the ceiling 16, showing a shielding layer 114 on the backside 108 of the ceiling panel 100. The shielding layer 114 may comprise the shielded wallpaper 22 or the metal-CVD coated substrate core 24 connected to the backside of the ceiling panel 100.

Most of the shielding products and techniques described above may be used to retrofit an existing building structure or to prepare a new construction. However, there may be situations where a modular construction (demountable or not) may be desired or warranted. In such situations the exemplary embodiment depicted in FIG. 21 may be useful. FIG. 21 is a cut-away perspective view of yet another exemplary embodiment of a shielded room 10 with modular wall panels 116, connecting brackets 118, floor 14, ceiling 16, a window 18, and a door 20.

FIG. 22 depicts a cross-section view of an exemplary embodiment of a shielded, modular wall panel 116. The shielded modular wall panel 116 is a composite laminate that may be prepared pre-site for installation on-site. The modular wall panel 116 of FIG. 22 comprises a core 120, a panel shielding layer 122 disposed on each face 124 of the core 120, an outer skin 126. The core 120 may be made of any suitable material, conductive or non-conductive. However, for easy in handling and for cost and weight considerations the core 120 may be made of typical construction material such as a foam core or drywall 96, or any other suitable material. Additionally, the outer skin 126 may also be made of any suitable material (such as the paper face of drywall or the like) that will adequately protect the panel shielding layer 122 from damage.

Each panel shielding layer 122 may comprise shielded wallpaper 22 or a metal-CVD coated substrate core 24 such as a NiCVD coated nonwoven paper 128, as depicted in FIG. 22. Each modular panel 116 has side edges 130, and each panel shielding layer 122 extends beyond the side edges 130 to form a wrap-around flap 132. Each wrap-around flap 132 may be wrapped around and rest flat against the nearest outer skin 126 as shown by the upper left hand wrap-around flap 132 of FIG. 22.

FIG. 23 is a cross-section view of an exemplary embodiment of a shielded, modular wall panel 116 and end bracket assembly 134. The end bracket assembly 134 comprises a metal channel 136 and a spacer 138. The metal channel 136 may be constructed from an extrudable metal by known extruding processes and has a pair of legs 140 that are spaced apart sufficiently to receive in reasonably snug engagement one of the side edges 130 of the modular wall panel 116 with both wrap-around flaps 132 wrapped around and against the outer skins 126. The pair of legs 140 are connected by web 142 and together the web 142 and legs 140 define a channel 144 into which the side edge 130 of a modular wall panel 116 may be inserted. The spacer 138 may be made from any suitable material (conductive or none conductive) such as wood, an elastomer, or the like. With this configuration, the shielding extends across the modular wall panel 116 to the outer face 146 of web 142.

FIG. 24 depicts a cross-section view of an exemplary embodiment of a panel-to-panel juncture 148 of FIG. 21 along line G-G. The panel-to-panel juncture 148 exists between modular wall panels 116 set side to side or end to end as along a wall 12. To span the panel-to-panel juncture 148, an H-shaped bracket assembly 150 may be used. The H-shaped bracket assembly 150 may comprise dual metal channels 152 and a pair of spacers 138. The dual metal channels 152 may be constructed from an extrudable metal by known extruding processes and has two pairs of legs 140 where each pair is spaced apart sufficiently to receive in reasonably snug engagement one of the side edges 130 of a modular wall panel 116 with both wrap-around flaps 132 wrapped around and against the outer skins 126. Each pair of legs 140 is connected by web 142 and together the web 142 and legs 140 define a pair of opposing channels 144 into which the side edges 130 of the modular wall panels 116 may be inserted. Again, each spacer 138 may be made from any suitable material (conductive or none conductive) such as wood, an elastomer, or the like. With this configuration, the shielding extends across both modular wall panels 116 and the panel-to-panel juncture 148.

FIGS. 25 and 26 depict panel-to-panel corner junctures 154 and alternative brackets used to maintain shielding through the corners. FIG. 25 is a cross-section view of an exemplary embodiment of a panel-to-panel corner juncture 154 of FIG. 21 along line H-H. The panel-to-panel corner juncture 154 exists between modular wall panels 116 set at right angle to each other as a corner between two walls 12. To span the panel-to-panel corner juncture 154, an angled bracket assembly 156 may be used. The angled bracket assembly 156 may comprise dual metal channels 152 and a pair of spacers 138. The dual metal channels 152 may be constructed from an extrudable metal by known extruding processes and has two pairs of legs 140 where each pair is spaced apart sufficiently to receive in reasonably snug engagement one of the side edges 130 of a modular wall panel 116 with both wrap-around flaps 132 wrapped around and against the outer skins 126. Each pair of legs 140 is connected by web 142 and together the web 142 and legs 140 define a pair of angled channels 158 into which the side edges 130 of the modular wall panels 116 may be inserted. As shown in FIG. 22, the exemplary embodiment depicted has a common portion 160 that is common to one leg 140 of one angled channel 158 and the web 142 of the other angled channel 158. Again, each spacer 138 may be made from any suitable material (conductive or none conductive) such as wood, an elastomer, or the like. With this configuration, the shielding extends across both modular wall panels 116 and the panel-to-panel corner juncture 154.

FIG. 26 depicts a cross-section view of an alternative exemplary embodiment of a panel-to-panel corner juncture 154 of FIG. 21 along line H-H with an anchoring screw 162 positioned to secure a modular wall panel 116 within its angled channel 158. The panel-to-panel corner juncture 154 exists between modular wall panels 116 set at right angle to each other as a corner between two walls 12. To span the panel-to-panel corner juncture 154, an angled bracket assembly 156 may be used. The angled bracket assembly 156 of FIG. 26 differs slightly from that depicted in FIG. 26 in that a larger spacer 138 is used so that an anchoring screw 162 may be driven through the dual metal channels 152, both spacers 138 and into the core 120 without penetrating any outer skin 130 or any panel shielding layer 126. The angled bracket assembly 156 may comprise dual metal channels 152 and a pair of spacers 138. The dual metal channels 152 may be constructed from an extrudable metal by known extruding processes and has two pairs of legs 140 where each pair is spaced apart sufficiently to receive in reasonably snug engagement one of the side edges 130 of a modular wall panel 116 with both wrap-around flaps 132 wrapped around and against the outer skins 126. Each pair of legs 140 is connected by web 142 and together the web 142 and legs 140 define a pair of angled channels 158 into which the side edges 130 of the modular wall panels 116 may be inserted. As shown in FIG. 23, the exemplary embodiment depicted has a common portion 160 (through which the anchoring screw 162 passes) that is common to one leg 140 of one angled channel and the web 142 of the other angled channel 158. Again, each spacer 138 may be made from any suitable material (conductive or none conductive) such as wood, an elastomer, or the like so long as each spacer maintains its structural integrity when penetrated by the anchoring screw 162. With this configuration, the shielding extends across both modular wall panels 116 and the panel-to-panel corner juncture 154.

It should be understood that another exemplary angled bracket assembly 156 may be created that is designed to span and shield a panel-to-panel corner juncture 154. Such angled bracket assembly 156 embodiment may be created by positioning two end bracket assemblies 134 (as depicted in FIG. 23) with the web 142 of one end bracket assembly 134 positioned adjacent and generally parallel to one of the legs 140 of the other end bracket assembly 134 and a conductive gasket (not shown, but understood by those skilled in the art) between. The conductive gasket may be made of any suitably conductive material such as a PCF-loaded elastomer. So that the conductive gasket need not bear the entire stress of the constructed corner, one or more anchoring screws 162 may be used to assure the stability of the corner in a manner similar to that depicted in FIG. 26.

With slight modification to the angled bracket assembly 156 and the spacers 138, the angled bracket assembly 156 may be modified to accommodate angles other than the right angle connection depicted in FIGS. 25 and 26. Those skilled in the art, armed with this disclosure would be able to make and use angled bracket assemblies 156 that connect adjacent modular wall panels 116 at an angle other than a right angle.

For exemplary methods or processes of the invention, the sequence and/or arrangement of steps described herein are illustrative and not restrictive. Accordingly, it should be understood that, although steps of various processes or methods may be shown and described as being in a sequence or temporal arrangement, the steps of any such processes or methods are not limited to being carried out in any particular sequence or arrangement, absent an indication otherwise. Indeed, the steps in such processes or methods generally may be carried out in various different sequences and arrangements while still falling within the scope of the present invention.

Additionally, any references to advantages, benefits, unexpected results, or operability of the present invention are not intended as an affirmation that the invention has been previously reduced to practice or that any testing has been performed. Likewise, unless stated otherwise, use of verbs in the past tense (present perfect or preterit) is not intended to indicate or imply that the invention has been previously reduced to practice or that any testing has been performed.

Exemplary embodiments of the present invention are described above. No element, act, or instruction used in this description should be construed as important, necessary, critical, or essential to the invention unless explicitly described as such. Although only a few of the exemplary embodiments have been described in detail herein, those skilled in the art will readily appreciate that many modifications are possible in these exemplary embodiments without materially departing from the novel teachings and advantages of this invention. Accordingly, all such modifications are intended to be included within the scope of this invention as defined in the appended claims.

In the claims, any means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. Unless the exact language "means for" (performing a particular function or step) is recited in the claims, a construction under Section 112, 6th paragraph is not intended. Additionally, it is not intended that the scope of patent protection afforded the present invention be defined by reading into any claim a limitation found herein that does not explicitly appear in the claim itself.

While specific embodiments and applications of the present invention have been illustrated and described, it is to be understood that the invention is not limited to the precise configuration and components disclosed herein. Various modifications, changes, and variations which will be apparent to those skilled in the art may be made in the arrangement, operation, and details of the methods and systems of the present invention disclosed herein without departing from the spirit and scope of the invention.

Those skilled in the art will appreciate that the present embodiments may be embodied in other specific forms without departing from its structures, methods, or other essential characteristics as broadly described herein and claimed hereinafter. The described embodiments are to be considered in all respects only as illustrative, and not restrictive. The scope of the invention is, therefore, indicated by the appended claims, rather than by the foregoing description. All changes that come within the meaning and range of equivalency of the claims are to be embraced within their scope.

What is claimed is:

1. An electromagnetically shielding wallpaper for connection to a building structure having a plurality of walls connected to define an enclosed volume to provide electromagnetic shielding of the building structure, the electromagnetically shielding wallpaper comprising:
   a metal-CVD (chemical vapor deposition) coated substrate core; and
   a resin impregnating the metal-CVD coated substrate core, the resin forming a combination comprising a resin-impregnated portion, an obverse layer and a reverse layer, the metal-CVD coated substrate core being resin impregnated and disposed between the obverse layer and the reverse layer.

2. The electromagnetically shielding wallpaper of claim 1, wherein the resin is a sealing resin that seals the metal-CVD coated substrate core from corrosion and the combination is vapor impermeable.

3. The electromagnetically shielding wallpaper of claim 1, wherein the metal-CVD coated substrate core comprises a Ni-CVD coated substrate core.

4. The electromagnetically shielding wallpaper of claim 1, wherein the metal-CVD coated substrate core comprises a nonwoven substrate.

5. The electromagnetically shielding wallpaper of claim 4, wherein the nonwoven substrate is an organic nonwoven substrate.

6. The electromagnetically shielding wallpaper of claim 5, wherein the organic nonwoven substrate comprises cellulose.

7. The electromagnetically shielding wallpaper of claim 1, further comprising an adhesive layer connected to the reverse layer.

8. The electromagnetically shielding wallpaper of claim 7, wherein the adhesive layer comprises at least one adhesive selected from the group consisting of wallpaper paste, an adhesive film, and a resinous penetrating adhesive.

9. The electromagnetically shielding wallpaper of claim 1, wherein the shielded wallpaper is formed as a plurality of sheets with each sheet having an edge and defining a shielded area where connected to the building structure, the edge of a first sheet of shielded wallpaper disposed to overlap the edge of a second sheet of shielded wallpaper whereby shielding is continuous over the combined shielded area of the first sheet and the second sheet.

10. The electromagnetically shielding wallpaper of claim 1, further comprising a shielded strip and wherein the shielded wallpaper is formed as a plurality of sheets with each sheet having an edge and defining a shielded area where connected to the building structure, the edge of a first sheet of shielded wallpaper disposed to abut the edge of a second sheet of shielded wallpaper, the shielded strip disposed to overlay and cover the abutting edges of the first sheet and the second sheet whereby shielding is continuous over the combined shielded area of the first sheet and the second sheet.

11. The electromagnetically shielding wallpaper of claim 1, wherein the shielded wallpaper is retrofit to an existing building structure.

12. The electromagnetically shielding wallpaper of claim 1, wherein the metal-CVD coated substrate core comprises a woven substrate.

13. The electromagnetically shielding wallpaper of claim 12, wherein the metal-CVD coated substrate core comprises a Ni-CVD coated woven substrate.

14. The electromagnetically shielding wallpaper of claim 13, wherein the woven substrate is an organic woven substrate.

15. An electromagnetically shielding wallpaper for connection to a building structure having a plurality of walls connected to define an enclosed volume to provide electromagnetic shielding of the building structure, the electromagnetically shielding wallpaper comprising:
   a metal-CVD coated substrate core, the metal-CVD coated substrate core comprising a nonwoven material and nickel as a metal in the metal-CVD coated substrate core; and
   a resin impregnating the metal-CVD coated substrate core, the resin forming a combination comprising a resin-impregnated portion, an obverse layer and a reverse layer, the metal-CVD coated substrate core being resin impregnated and disposed between the obverse layer and the reverse layer.

16. The electromagnetically shielding wallpaper of claim 15, wherein the shielded wallpaper is retrofit to an existing building structure.

17. The electromagnetically shielding wallpaper of claim 15, wherein the reverse layer adheres the shielded wallpaper to the shielded building structure.

18. The electromagnetically shielding wallpaper of claim 15, further comprising an adhesive layer connected to the reverse layer of resin.

19. The electromagnetically shielding wallpaper of claim 18, wherein the adhesive layer comprises at least one adhesive selected from the group consisting of wallpaper paste, an adhesive film, and a resinous penetrating adhesive.

20. The electromagnetically shielding wallpaper of claim 15, wherein the resin is a sealing resin that seals the metal-CVD coated substrate core from corrosion.

21. The electromagnetically shielding wallpaper of claim 1, wherein the reverse layer of the electromagnetically shielding wallpaper connects the electromagnetically shielding wallpaper to the building structure.

* * * * *